US011230499B2

(12) United States Patent
Oka et al.

(10) Patent No.: US 11,230,499 B2
(45) Date of Patent: Jan. 25, 2022

(54) CERAMIC ELECTRONIC COMPONENT

(71) Applicant: Murata Manufacturing Co., Ltd., Nagaokakyo (JP)

(72) Inventors: Takahiro Oka, Nagaokakyo (JP); Tatsunori Kan, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 675 days.

(21) Appl. No.: 16/123,031

(22) Filed: Sep. 6, 2018

(65) Prior Publication Data

US 2019/0002351 A1 Jan. 3, 2019

Related U.S. Application Data

(63) Continuation of application No. PCT/JP2017/009679, filed on Mar. 10, 2017.

(30) Foreign Application Priority Data

Mar. 22, 2016 (JP) ............................ JP2016-057634
May 17, 2016 (JP) ............................ JP2016-099130

(51) Int. Cl.
*H01G 4/12* (2006.01)
*H01G 4/30* (2006.01)
(Continued)

(52) U.S. Cl.
CPC .............. *C04B 35/16* (2013.01); *C03C 3/085* (2013.01); *C03C 14/004* (2013.01);
(Continued)

(58) Field of Classification Search
CPC ........... H01L 23/15; H01L 2224/27187; C04B 35/16; C04B 35/195; C03C 3/085;
(Continued)

(56) References Cited

U.S. PATENT DOCUMENTS 4,167,015 A * 9/1979 Hanak ..................... H01L 29/04 136/255
6,331,811 B2 * 12/2001 Shibuya .................. H01C 3/04 338/307
(Continued)

FOREIGN PATENT DOCUMENTS

JP H05221686 A 8/1993
JP H1075060 A 3/1998
(Continued)

OTHER PUBLICATIONS

International Search Report issued for PCT/JP2017/009679, dated May 30, 2017.
(Continued)

*Primary Examiner* — Ida M Soward
(74) *Attorney, Agent, or Firm* — Arent Fox LLP

(57) ABSTRACT

A ceramic electronic component that includes a ceramic insulator and a terminal electrode on a surface of the ceramic insulator. The ceramic insulator contains a crystalline material and an amorphous material. The terminal electrode contains a metal and an oxide. The crystalline material and the oxide contain, in common, at least one type of a metal element. An adjacent region in the ceramic insulator which surrounds the terminal electrode and has a thickness of 5 μm is higher in concentration of the metal element than a remote region which is distant from the terminal electrode by 100 μm and has a thickness of 5 μm.

8 Claims, 7 Drawing Sheets

(51) Int. Cl.

| | |
|---|---|
| ***H05K 3/12*** | (2006.01) |
| ***H05K 3/42*** | (2006.01) |
| ***H01L 23/15*** | (2006.01) |
| ***C04B 35/16*** | (2006.01) |
| ***C03C 14/00*** | (2006.01) |
| ***C04B 35/195*** | (2006.01) |
| ***C03C 3/085*** | (2006.01) |
| ***H05K 3/46*** | (2006.01) |
| *H01L 23/498* | (2006.01) |
| *H01L 23/13* | (2006.01) |

(52) U.S. Cl.

CPC ............. *C04B 35/195* (2013.01); *H01G 4/12* (2013.01); *H01G 4/129* (2013.01); *H01G 4/1227* (2013.01); *H01G 4/30* (2013.01); *H01L 23/15* (2013.01); *H05K 3/12* (2013.01); *H05K 3/4629* (2013.01); *C04B 2235/3215* (2013.01); *C04B 2235/3232* (2013.01); *H01L 23/13* (2013.01); *H01L 23/49822* (2013.01); *H01L 2224/29187* (2013.01); *H05K 3/46* (2013.01)

(58) Field of Classification Search

CPC ...... C03C 14/004; H01G 4/12; H01G 4/1227; H01G 4/129; H05K 3/12; H05K 3/4629

See application file for complete search history.

(56) References Cited

U.S. PATENT DOCUMENTS

| | | | | |
|---|---|---|---|---|
| 6,929,874 | B2 * | 8/2005 | Hiramatsu | C04B 35/5622 428/698 |
| 7,232,781 | B2 * | 6/2007 | Ishitobi | B32B 18/00 428/210 |
| 2009/0269875 | A1 * | 10/2009 | Kato | H01L 31/072 438/58 |
| 2011/0300355 | A1 | 12/2011 | Katsube | |
| 2012/0003450 | A1 | 1/2012 | Motoya et al. | |
| 2012/0205606 | A1 * | 8/2012 | Lee | H01L 45/04 257/2 |

FOREIGN PATENT DOCUMENTS

| | | | |
|---|---|---|---|
| JP | 2003258433 | A | 9/2003 |
| JP | 2008251782 | A | 10/2008 |
| JP | 2007273914 | A | 8/2011 |
| JP | 2012015433 | A | 1/2012 |
| JP | 2014002992 | A | 1/2014 |
| WO | 2010092970 | A1 | 8/2010 |

OTHER PUBLICATIONS

Written Opinion of the International Searching Authority issued for PCT/JP2017/009679, dated May 30, 2017.

* cited by examiner

CERAMIC ELECTRONIC COMPONENT

CROSS REFERENCE TO RELATED APPLICATIONS

The present application is a continuation of International application No. PCT/JP2017/009679, filed Mar. 10, 2017, which claims priority to Japanese Patent Application No. 2016-057634, filed Mar. 22, 2016, and Japanese Patent Application No. 2016-099130, filed May 17, 2016, the entire contents of each of which are incorporated herein by reference.

FIELD OF THE INVENTION

This invention relates to a ceramic electronic component and a method of manufacturing a ceramic electronic component, and particularly to a ceramic electronic component in which contained insulator ceramic is what is called glass ceramic containing a crystalline material and an amorphous material.

BACKGROUND OF THE INVENTION

A ceramic wiring board includes a ceramic insulator, a via conductor formed orthogonal to a main surface of the ceramic insulator and a pattern conductor formed in parallel thereto, and a terminal electrode formed on the main surface of the ceramic insulator. The ceramic wiring board is often used in a high frequency region not lower than a GHz band with increase in speed of information communication. Therefore, for example, a ceramic insulator low in dielectric constant, typically referred to as a glass ceramic, in which a fine crystalline material is precipitated in an amorphous material is employed as the ceramic insulator in order to lower transmission loss.

The terminal electrode to which an electronic component such as an IC chip is connected is formed of a conductor paste containing metal powders composed of Cu assumed to be excellent in resistance to migration and an organic vehicle. The conductor paste may further contain amorphous powders. The amorphous powders are added in order to coordinate shrinking behaviors at the time of sintering between source material powders of the ceramic insulator included in the ceramic wiring board and metal powders and to strengthen bonding between the ceramic insulator and each conductor.

When a yet-to-be-fired terminal electrode formed of such a conductor paste is fired, a part of an upper surface of the terminal electrode may be covered with the amorphous material. The upper surface of the terminal electrode refers to a surface which is exposed without being opposed to the main surface of the ceramic wiring board.

The upper surface of the terminal electrode is often plated in order to improve solderability. When a part of the upper surface of the terminal electrode is covered with the amorphous material as described previously, an area of an exposed metal portion decreases and hence a sufficient amount of plating film may not be formed on the upper surface of the terminal electrode.

Such an unfavorable condition may be caused also in firing of a yet-to-be fired via conductor formed of a similar conductor paste. Namely, as a result of covering with the amorphous material, of a part of an end portion of the via conductor exposed at the main surface of the ceramic wiring board, a sufficient amount of plating film may not be formed in forming a terminal electrode with plating at the end portion of the via conductor.

Japanese Patent Laying-Open No. 2003-258433 (PTL 1) has proposed an example of a ceramic wiring board in an attempt to overcome the unfavorable condition which may be caused in forming a via conductor.

FIG. 11 is a schematic diagram of a ceramic wiring board 300 described in PTL 1. Ceramic wiring board 300 includes a ceramic insulator 31 obtained by layering a plurality of glass ceramic layers and a via conductor 32 and a pattern conductor 33 formed therein and composed of Cu or a Cu alloy. In via conductor 32, a portion 32*b* formed in an insulating layer 31*b* located at a surface of ceramic insulator 31 is lower in content of an amorphous material than a portion 32*a* formed in an insulating layer 31*a* located inside.

Therefore, ceramic wiring board 300 including the features above is allegedly advantageous in that secure bonding between ceramic insulator 31 and via conductor 32 is maintained and an end portion of via conductor 32 is not covered with the amorphous material.

PTL 1: Japanese Patent Laying-Open No. 2003-258433

SUMMARY OF THE INVENTION

Studies conducted by the inventors for inventing this invention will be described below.

In a yet-to-be-fired ceramic wiring board including a yet-to-be-fired ceramic insulator and a yet-to-be-fired via conductor, an amorphous material contained in the yet-to-be-fired ceramic insulator and an amorphous material contained in the yet-to-be-fired via conductor generally have high affinity for each other. Therefore, in a step of firing the yet-to-be-fired ceramic wiring board, the amorphous material contained in the yet-to-be-fired ceramic insulator may be introduced into the via conductor during firing or spreads as being molten to an end portion of the via conductor. Even when a content of the amorphous material in the yet-to-be-fired via conductor in the vicinity of a surface of the yet-to-be-fired ceramic wiring board is decreased, the end portion of the via conductor may be covered with the amorphous material as in a conventional example.

For signal processing at a high speed in recent years, the number of external electrodes on an IC chip is increased and a pitch therebetween is made smaller. Accordingly, the number of terminal electrodes on a ceramic wiring board on which an IC chip is mounted is increased and a pitch therebetween is made smaller. For increase in number of terminal electrodes and decrease in pitch therebetween, the via conductor should be smaller in diameter.

When a diameter of the via conductor is greater, for example, than 100 μm, an area of an exposed metal portion necessary for forming a terminal electrode with plating can be secured even though an end portion of the via conductor is slightly covered with an amorphous material. In order to implement a terminal electrode allowing mount of a recent IC chip, however, formation of a via conductor small in diameter not larger than 100 μm may be required. In that case, an amount of introduction of the amorphous material contained in a yet-to-be-fired ceramic insulator with respect to a volume of a yet-to-be-fired via conductor is greater than the via conductor having a diameter greater than 100 μm. Consequently, most of the end portion of the via conductor is covered with the amorphous material. Therefore, it may be difficult to form a terminal electrode with plating.

Such an unfavorable condition may similarly be caused also when the technique disclosed in PTL 1 is applied to formation of a terminal electrode and a terminal electrode is formed of a conductor paste with a content of amorphous powders therein being decreased or a conductor paste without containing amorphous powders. In a step of firing the yet-to-be-fired ceramic wiring board, the amorphous material contained in the yet-to-be-fired ceramic insulator may be introduced into the terminal electrode or spread as being molten over an upper surface of the terminal electrode during firing. In that case, as a part of the upper surface of the terminal electrode is covered with the amorphous material, an area of the exposed metal portion decreases and hence a sufficient amount of plating film may not be formed on the upper surface of the terminal electrode.

Such an unfavorable condition may be noticeable when an area of the terminal electrode is small as seen in the example of the via conductor. For example, formation of a terminal electrode small in area not greater than 100-μm square may be required for a ceramic wiring board on which a recent IC chip can be mounted. In that case, an amount of introduction of the amorphous material contained in the yet-to-be-fired ceramic insulator with respect to a volume of the yet-to-be-fired terminal electrode is greater than the yet-to-be-fired terminal electrode having an area greater than 100-μm square. In that case, most of the upper surface of the terminal electrode may be covered with the amorphous material. Consequently, it may be difficult to form a plating film on the upper surface of the terminal electrode.

The unfavorable condition above is a concern not only in a ceramic wiring board but also similarly in a ceramic electronic component including a ceramic insulator as an electronic component body in which a terminal electrode small in area is formed on a side surface of the electronic component body.

An object of this invention is to provide a ceramic electronic component in which covering of an upper surface of a terminal electrode with an amorphous material is suppressed and a plating film can reliably and readily be formed on the upper surface of the terminal electrode and a method of manufacturing such a ceramic electronic component.

In an aspect of this invention, in order to suppress covering of an upper surface of a terminal electrode with an amorphous material, a component of a conductor paste for forming the terminal electrode is improved, and consequently, a structure of a ceramic insulator in the vicinity of the terminal electrode is improved.

A aspect of the present invention is directed initially to a ceramic electronic component. The ceramic electronic component includes a ceramic wiring board and a component in which a terminal electrode is formed on a surface of a chip type ceramic electronic component body.

A ceramic electronic component according to an aspect of this invention includes a ceramic insulator and a terminal electrode provided on a surface of the ceramic insulator. The ceramic insulator contains a crystalline material and an amorphous material. The terminal electrode contains a metal and an oxide. The crystalline material in the ceramic insulator and the oxide in the terminal electrode contain in common at least one type of a metal element. In the ceramic insulator, an adjacent region which surrounds the terminal electrode and has a thickness of 5 pun is higher in concentration of the metal element than a remote region which is distant from the terminal electrode by 100 μm and has a thickness of 5 μm.

In firing a yet-to-be-fired ceramic electronic component, ions of the metal element which is a component of the oxide in the terminal electrode are considered to be diffused in the amorphous material in the ceramic insulator. Since a solid solubility limit of the ions of the metal element is low on the other hand, the ions of the metal element and the component in the amorphous material react with each other and a crystalline material is precipitated from the amorphous material.

Therefore, in the ceramic electronic component, an amount of the amorphous material contained in the adjacent region decreases. When the ions of the metal element and the amorphous material react with each other to produce the crystalline material, a metal element (for example, an alkaline-earth metal element) in the amorphous material with a function to lower a viscosity of the amorphous material in a molten state at a high temperature is taken into the crystalline material. Therefore, the remaining amorphous material is high in viscosity at a high temperature.

Therefore, in the ceramic electronic component, in firing the yet-to-be-fired ceramic electronic component, the amorphous material introduced into a yet-to-be-fired terminal electrode from a yet-to-be-fired ceramic insulator decreases and covering of the upper surface of the terminal electrode with the amorphous material is suppressed. Consequently, a plating film can reliably and readily be formed on the upper surface of the terminal electrode. Since ions of the metal element which is the component of the oxide in the terminal electrode are diffused in the amorphous material in the ceramic insulator, the terminal electrode and the ceramic insulator are firmly bonded to each other and separation between the terminal electrode and the ceramic insulator is suppressed.

The ceramic electronic component according to this invention is preferably characterized in that an absolute value of a difference in basicity between the amorphous material in the ceramic insulator and the oxide in the terminal electrode is not greater than 0.049 when a basicity B of the oxide in the terminal electrode is expressed in expressions (1) to (3) below.

$$B = \sum_i n_i B(Mi - O) \tag{1}$$

$$B(Mi - O) = \frac{B(Mi - O_0) - B(Si - O_0)}{B(Ca - O_0) - B(Si - O_0)} \tag{2}$$

$$B(Mi - O_0) = \frac{(r_{Mi} + 1.4)^2}{2Z_{Mi}} \tag{3}$$

In the expressions, B(Mi-O) represents a basicity of each oxide in the terminal electrode (a cation being expressed as Mi), B(Mi-$O_0$) represents oxygen donation capability of MiO when an oxide of a certain element is expressed as MiO, B(Si—$O_0$) represents oxygen donation capability of $SiO_2$, B(Ca—$O_0$) represents oxygen donation capability of CaO, $n_i$ represents a composition ratio of each cation Mi, $r_{Mi}$ represents an ion radius (Å) of each cation Mi, and $Z_{Mi}$ represents a valence of each cation Mi. B(Mi-O) is calculated by using a value of an ion radius according to Pauling as a value of an ion radius of each cation Mi and obtained by rounding a calculated value off to four decimal places. A difference in basicity is obtained by rounding a calculated value off to three decimal places.

When a difference in basicity between the oxide in the terminal electrode and the amorphous material in the ceramic insulator is small (not greater than 0.049), only an extremely small amount of oxide solid solution can be formed in the amorphous material. Therefore, the diffused oxide is unstable in the amorphous material and crystallization is promoted. Therefore, in the ceramic electronic component, an amount of amorphous material contained in the adjacent region reliably decreases. The remaining amorphous material is reliably high in viscosity at a high temperature.

Therefore, in the ceramic electronic component, in firing a yet-to-be-fired ceramic electronic component, the amorphous material introduced into the yet-to-be-fired terminal electrode from the yet-to-be-fired ceramic insulator decreases and covering of the upper surface of the terminal electrode with the amorphous material is reliably suppressed. Consequently, a plating film can more reliably and readily be formed on the upper surface of the terminal electrode.

The ceramic electronic component according to this invention is preferably characterized in that the adjacent region contains the crystalline material composed of the metal element contained in common in the crystalline material in the ceramic insulator and the oxide in the terminal electrode.

As crystallization of the amorphous material contained in the adjacent region is promoted, an amount of the amorphous material reliably decreases. The remaining amorphous material is reliably high in viscosity at a high temperature.

Therefore, in the ceramic electronic component, in firing a yet-to-be-fired ceramic electronic component, the amorphous material introduced into the yet-to-be-fired terminal electrode from the yet-to-be-fired ceramic insulator decreases and covering of the upper surface of the terminal electrode with the amorphous material is reliably suppressed. Consequently, a plating film can reliably and readily be formed on the upper surface of the terminal electrode.

The ceramic electronic component in which the adjacent region contains the crystalline material composed of the metal element contained in common in the crystalline material in the ceramic insulator and the oxide in the terminal electrode is further preferably characterized in that the metal element is Ti.

An amount of solid solution of Ti in the amorphous material is small. In an example in which the crystalline material in the ceramic insulator and the oxide in the terminal electrode contain Ti in common, even though Ti ions are diffused in the amorphous material, the Ti ions function to precipitate the crystalline material containing Ti in the amorphous material. An amorphous component is also used together with Ti for precipitation of the crystalline material.

Therefore, in the ceramic electronic component, in firing a yet-to-be-fired ceramic electronic component, the amorphous material introduced into the yet-to-be-fired terminal electrode from the yet-to-be-fired ceramic insulator effectively decreases. Therefore, covering of the upper surface of the terminal electrode with the amorphous material is reliably suppressed. Consequently, the oxide in the terminal electrode can be decreased and a low resistance of the terminal electrode and effective formation of a plating film on the upper surface of the terminal electrode can both be achieved.

The ceramic electronic component in which the crystalline material in the ceramic insulator and the oxide in the terminal electrode contain Ti in common as the metal element is further preferably characterized in that the crystalline material composed of the metal element contains a fresnoite type compound containing Ba, Ti, and Si.

In the ceramic electronic component, owing to generation of the fresnoite type compound, the terminal electrode and the ceramic insulator are more firmly bonded to each other and hence separation between the terminal electrode and the ceramic insulator is reliably suppressed. The fresnoite type compound is high in chemical durability and hardly eroded by a plating solution when a plating film is formed on the upper surface of the terminal electrode. Therefore, separation between the terminal electrode and the ceramic insulator is reliably suppressed also after formation of the plating film.

The ceramic electronic component in which the adjacent region contains the crystalline material composed of the metal element contained in common in the crystalline material in the ceramic insulator and the oxide in the terminal electrode is further preferably characterized in that the metal element is Al.

In an example in which the crystalline material in the ceramic insulator and the oxide in the terminal electrode contain Al in common, Al also is considered as being effective for decrease in amorphous material introduced into the yet-to-be-fired terminal electrode from the yet-to-be-fired ceramic insulator as described previously in firing the yet-to-be-fired ceramic electronic component.

Therefore, in the ceramic electronic component, covering of the upper surface of the terminal electrode with the amorphous material is reliably suppressed. Consequently, the oxide in the terminal electrode can be decreased and a low resistance of the terminal electrode and effective formation of a plating film on the upper surface of the terminal electrode can both be achieved.

The ceramic electronic component in which the crystalline material in the ceramic insulator and the oxide in the terminal electrode contain Al in common as the metal element is further preferably characterized in that the crystalline material composed of the metal element contains a celsian type compound containing Ba, Al, and Si.

In the ceramic electronic component, owing to generation of the celsian type compound, the terminal electrode and the ceramic insulator are more firmly bonded to each other and hence separation between the terminal electrode and the ceramic insulator is reliably suppressed. The celsian type compound is high in chemical durability and hardly eroded by a plating solution when a plating film is formed on the upper surface of the terminal electrode. Therefore, separation between the terminal electrode and the ceramic insulator is reliably suppressed also after formation of the plating film.

The ceramic electronic component in which the adjacent region contains the crystalline material composed of the metal element contained in common in the crystalline material in the ceramic insulator and the oxide in the terminal electrode is further preferably characterized in that the amorphous material in the ceramic insulator contains Ba and Si. The crystalline material composed of the metal element contains an Si oxide, a fresnoite type compound containing Ba, Ti, and Si, and a celsian type compound containing Ba, Al, and Si.

In the ceramic electronic component, owing to generation of the Si oxide, the fresnoite type compound, and the celsian type compound, the terminal electrode and the ceramic insulator are more firmly bonded to each other and hence separation between the terminal electrode and the ceramic insulator is reliably suppressed. Furthermore, strength of the ceramic insulator is enhanced. As described previously, separation between the terminal electrode and the ceramic insulator is reliably suppressed also after a plating film is formed.

This invention is directed also to a method of manufacturing a ceramic electronic component.

A method of manufacturing a ceramic electronic component according to this invention is a method of manufacturing a ceramic electronic component including a ceramic insulator and a terminal electrode provided on a surface of the ceramic insulator, and the method includes first to fifth steps below.

The first step is a step of obtaining green sheets each containing source material powders of the ceramic insulator. The second step is a step of obtaining a conductor paste containing metal powders, an additive containing at least one type of a metal element in common to the source material powders of the ceramic insulator, and an organic vehicle. The third step is a step of forming a yet-to-be-fired terminal electrode on a main surface of at least one of the green sheets with the conductor paste.

The fourth step is a step of obtaining a yet-to-be-fired ceramic electronic component including a yet-to-be-fired ceramic insulator and the yet-to-be-fired terminal electrode provided on a surface of the yet-to-be-fired ceramic insulator by layering the green sheets including the green sheet having the yet-to-be-fired terminal electrode formed on the main surface such that the yet-to-be-fired terminal electrode does not lie between the green sheets.

The fifth step is a step of obtaining a ceramic insulator containing a crystalline material containing the metal element and an amorphous material and obtaining a terminal electrode containing a metal and an oxide by firing the yet-to-be-fired ceramic electronic component to sinter the yet-to-be-fired ceramic insulator and sinter the yet-to-be-fired terminal electrode.

According to the method of manufacturing a ceramic electronic component, in firing the yet-to-be-fired ceramic electronic component, the amorphous material introduced into the yet-to-be-fired terminal electrode from the yet-to-be-fired ceramic insulator decreases and covering of the upper surface of the terminal electrode with the amorphous material can be suppressed. Consequently, a plating film can reliably and readily be formed on the upper surface of the terminal electrode.

The method of manufacturing a ceramic electronic component according to this invention is preferably characterized in that, in the fifth step, the metal element is diffused from the additive into the amorphous material so that an adjacent region in the ceramic insulator which surrounds the terminal electrode and has a thickness of 5 μm is higher in concentration of the metal element than a remote region which is distant from the terminal electrode by 100 μm and has a thickness of 5 μm.

According to the method of manufacturing a ceramic electronic component, ions of the metal element which is the component of the oxide in the terminal electrode are diffused in the amorphous material in the ceramic insulator, so that the terminal electrode and the ceramic insulator are firmly bonded to each other and separation between the terminal electrode and the ceramic insulator can be suppressed.

The method of manufacturing a ceramic electronic component according to this invention and a preferred embodiment thereof are preferably characterized in that the source material powders of the ceramic insulator contain a compound containing $SiO_2$, $Al_2O_3$, $TiO_2$, and Ba.

According to the method of manufacturing a ceramic electronic component, the source material powders of the ceramic insulator can generate a fresnoite type compound and a celsian type compound in the ceramic insulator as a result of reactive sintering of the source material powders. Consequently, a ceramic electronic component high in strength can be obtained.

The method of manufacturing a ceramic electronic component according to this invention and a preferred embodiment thereof are preferably characterized in that the additive contained in the conductor paste is at least one of $TiO_2$ powders and $Al_2O_3$ powders.

When the additive contained in the conductor paste is at least one of $TiO_2$ powders and $Al_2O_3$ powders, an amount of solid solution of Ti ions in the $TiO_2$ powders and of Al ions in the $Al_2O_3$ powders is small even though they are diffused in the amorphous material. Therefore, the Ti ions function to precipitate the crystalline material containing Ti in the amorphous material, and the Al ions function to precipitate the crystalline material containing Al in the amorphous material. An amorphous component is also used together with the metal ions for precipitation of the crystalline material.

Therefore, according to the method of manufacturing a ceramic electronic component, in firing the yet-to-be-fired ceramic electronic component, the amorphous material introduced into the yet-to-be-fired terminal electrode from the yet-to-be-fired ceramic insulator effectively decreases and covering of the upper surface of the terminal electrode with the amorphous material can reliably be suppressed. Consequently, the oxide in the terminal electrode can be decreased and a low resistance of the terminal electrode and effective formation of a plating film on the upper surface of the terminal electrode can both be achieved.

The method of manufacturing a ceramic electronic component in which the additive contained in the conductor paste is at least one of the $TiO_2$ powders and the $Al_2O_3$ powders is further preferably characterized in that the $TiO_2$ powders and the $Al_2O_3$ powders have a specific surface area not less than 10 $m^2/g$.

As a specific surface area of the $TiO_2$ powders is larger, activity at the surface of the powders is higher. Then, an amount of diffused Ti ions increases even though an amount of addition of the powders to the conductor paste is small. Therefore, a large amount of small crystalline material of the fresnoite type compound can be generated in the adjacent region surrounding the terminal electrode. As a specific surface area also of the $Al_2O_3$ powders is larger, an amount of diffused Al ions increases and hence a large amount of small crystalline material of the celsian type compound can be generated in the adjacent region surrounding the terminal electrode.

Therefore, according to the method of manufacturing a ceramic electronic component, in firing the yet-to-be-fired ceramic electronic component, the amorphous material introduced into the yet-to-be-fired terminal electrode from the yet-to-be-fired ceramic insulator further effectively decreases and covering of the upper surface of the terminal electrode with the amorphous material can more reliably be suppressed. Consequently, the oxide in the terminal electrode can be decreased and a low resistance of the terminal electrode and effective formation of a plating film on the upper surface of the terminal electrode can both be achieved.

The method of manufacturing a ceramic electronic component according to this invention and a preferred embodiment thereof are preferably characterized in that the additive contained in the conductor paste is at least one of a Ti-containing organic compound and an Al-containing organic compound.

The Ti-containing organic compound is converted to $TiO_2$ which is small and has an extremely large specific surface area as a result of burning and oxidation in firing of the yet-to-be-fired ceramic electronic component. Therefore, diffusibility of Ti ions is high, and by adding a small amount of Ti-containing organic compound, a large amount of small crystalline material of the fresnoite type compound can be generated in the adjacent region surrounding the terminal electrode. The Al-containing organic compound is also similarly converted to $Al_2O_3$ extremely large in specific surface area, and it can generate a large amount of small crystalline material of the celsian type compound in the adjacent region surrounding the terminal electrode.

Therefore, according to the method of manufacturing a ceramic electronic component, in firing the yet-to-be-fired ceramic electronic component, the amorphous material introduced into the yet-to-be-fired terminal electrode from the yet-to-be-fired ceramic insulator further effectively decreases and covering of the upper surface of the terminal electrode with the amorphous material can more reliably be suppressed. Consequently, the oxide in the terminal electrode can be decreased and a low resistance of the terminal electrode and effective formation of a plating film on the upper surface of the terminal electrode can both be achieved.

The method of manufacturing a ceramic electronic component according to this invention and a preferred embodiment thereof are preferably characterized in that the fifth step includes holding the yet-to-be-fired ceramic insulator for one hour or longer within a temperature range not lower than $T_1$° C. and not higher than $(T_1+50)$° C. and holding the yet-to-be-fired ceramic insulator for one hour or longer at a prescribed temperature exceeding $(T_1+50)$° C., with $T_1$ representing a sintering start temperature of the yet-to-be-fired ceramic insulator.

The firing step in accordance with a prescribed temperature profile is adopted as the fifth step, so that at least one type of metal elements in the additive contained in the yet-to-be-fired terminal electrode can effectively be diffused in the amorphous material and the crystalline material can be precipitated.

Therefore, according to the method of manufacturing a ceramic electronic component, in firing the yet-to-be-fired ceramic electronic component, the amorphous material introduced into the yet-to-be-fired terminal electrode from the yet-to-be-fired ceramic insulator further effectively decreases and covering of the upper surface of the terminal electrode with the amorphous material can more reliably be suppressed. Consequently, the oxide in the terminal electrode can be decreased and a low resistance of the terminal electrode and effective formation of a plating film on the upper surface of the terminal electrode can both be achieved.

The method of manufacturing a ceramic electronic component in which the firing step in accordance with a prescribed temperature profile is adopted as the fifth step is further preferably characterized in that the fourth step further includes layering a shrinkage suppression green sheet containing source material powders for a shrinkage suppression material which does not shrink by sintering at $(T_1+50)$° C. on one main surface and the other main surface of the yet-to-be-fired ceramic electronic component.

The yet-to-be-fired ceramic electronic component lies between the shrinkage suppression green sheets so that shrinkage of the ceramic insulator in a direction of the main surface during firing of the ceramic electronic component is suppressed. The shrinkage suppression green sheet slightly reacts with the additive contained in the yet-to-be-fired terminal electrode during firing of the ceramic electronic component. Consequently, shrinkage of the terminal electrode in the direction of the main surface is suppressed owing to a pinning effect of a reactant.

Therefore, according to the method of manufacturing a ceramic electronic component, shrinkage of the ceramic insulator and the terminal electrode in the direction of the main surface is suppressed, and hence dimension accuracy of the fired ceramic electronic component can extremely be high.

In the ceramic electronic component according to this invention, in firing a yet-to-be-fired ceramic electronic component, the amorphous material introduced into the yet-to-be-fired terminal electrode from the yet-to-be-fired ceramic insulator decreases and covering of the upper surface of the terminal electrode with the amorphous material is suppressed. Consequently, a plating film can reliably and readily be formed on the upper surface of the terminal electrode. Ions of the metal element which is the component of the oxide in the terminal electrode are diffused in the amorphous material in the ceramic insulator, so that the terminal electrode and the ceramic insulator are firmly bonded to each other and separation between the terminal electrode and the ceramic insulator is suppressed.

According to the method of manufacturing a ceramic electronic component according to this invention, in firing a yet-to-be-fired ceramic electronic component, the amorphous material introduced into the yet-to-be-fired terminal electrode from the yet-to-be-fired ceramic insulator decreases and covering of the upper surface of the terminal electrode with the amorphous material can be suppressed. Consequently, a plating film can reliably and readily be formed on the upper surface of the terminal electrode. Ions of the metal element which is the component of the oxide in the terminal electrode are diffused in the amorphous material in the ceramic insulator, so that the terminal electrode and the ceramic insulator are firmly bonded to each other and separation between the terminal electrode and the ceramic insulator can be suppressed.

DETAILED DESCRIPTION OF THE PREFERRED EMBODIMENTS

Features of this invention will be described below in further detail with reference to embodiments of this invention.

<<First Embodiment of Ceramic Electronic Component>>

A ceramic electronic component 100 according to an embodiment of this invention will be described with reference to FIGS. 1A and 1B. In a first embodiment, ceramic electronic component 100 is configured as a ceramic wiring board for mounting active components such as an IC chip and passive components such as a capacitor and interconnecting and modularizing those components.

Figure 1A:
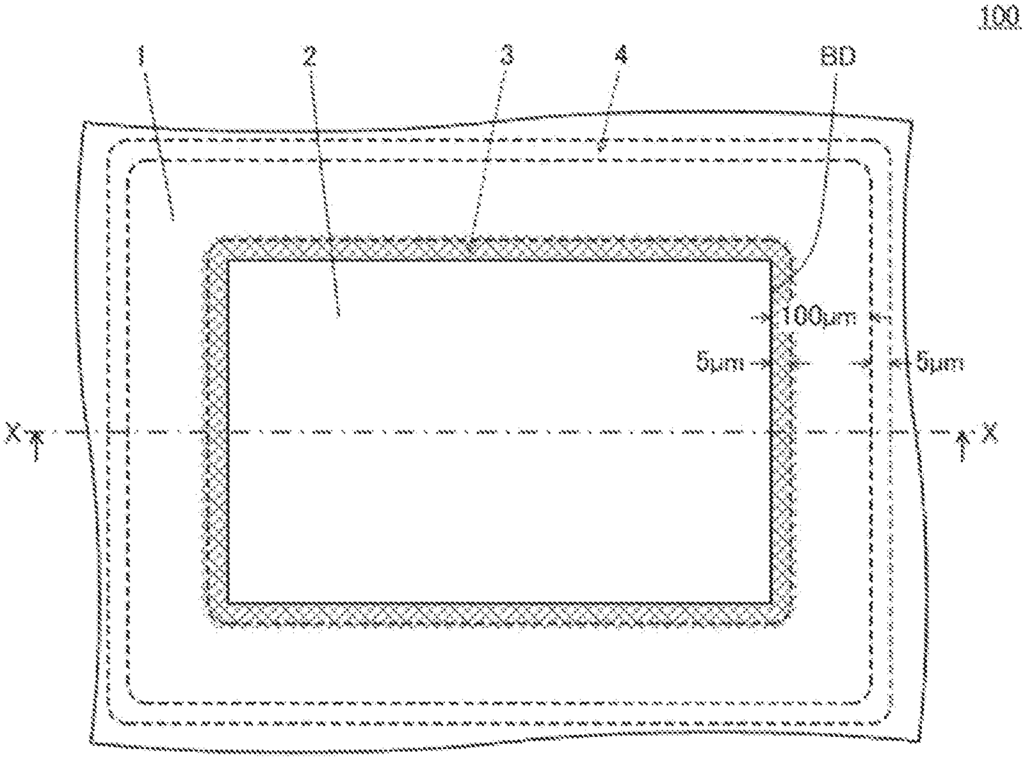
FIG. 1A is a diagram schematically showing as being enlarged, a part of an upper surface and a part of a cross-section of a ceramic electronic component (ceramic wiring board) 100 according to a first embodiment of this invention.

FIG. 1A is a diagram schematically showing and enlarged, a part of an upper surface of ceramic electronic component 100. FIG. 1B is a diagram schematically showing and enlarged, a part of a cross-section of ceramic electronic component 100 at a cut plane including the line X-X shown in FIG. 1A.

Ceramic electronic component 100 includes a ceramic insulator 1 and a terminal electrode 2. In this embodiment, ceramic insulator 1 contains $SiO_2$, $Al_2O_3$, celsian ($BaAl_2Si_2O_8$), and fresnoite ($Ba_2TiSi_2O_8$) as a crystalline material which will be described later. The ceramic insulator 1 also contains a glass component containing an oxide of Si, Ba, Mn, Al, Ti, Zr, and Mg as an amorphous material. Terminal electrode 2 contains Cu as a metal as will be described later, and contains $TiO_2$ and $Al_2O_3$ as an oxide. A shape of the terminal electrode 2 is rectangular in a top view thereof. Therefore, in the first embodiment, the crystalline material in ceramic insulator 1 and the oxide in terminal electrode 2 contain Ti or Al in common.

Figure 1B:
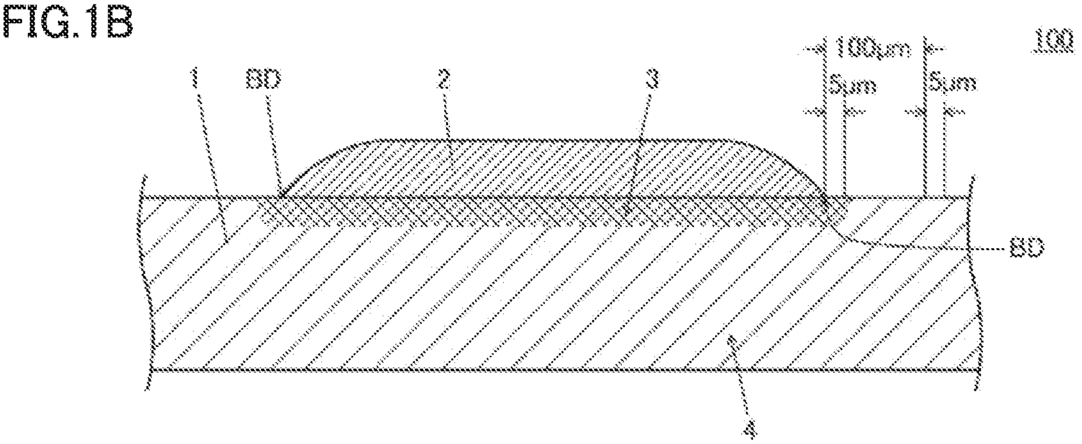
FIG. 1B is a diagram schematically showing as being enlarged, a part of the cross-section of ceramic electronic component 100 at a cut plane including the line X-X shown in FIG. 1A.

As shown in FIGS. 1A and 1B, a region in ceramic insulator 1 having a thickness of 5 μm from a boundary BD between ceramic insulator 1 and terminal electrode 2 is defined as an adjacent region 3. A region having a thickness of 5 μm distant by 100 μm from the boundary BD is defined as a remote region 4 (i.e., a region from 100 μm to 105 μm from the boundary BD is the remote region).

Boundary BD between ceramic insulator 1 and terminal electrode 2, adjacent region 3 surrounding terminal electrode 2 in ceramic insulator 1, and remote region 4 distant from the terminal electrode by a prescribed distance or more are defined with a method below.

Initially, ceramic electronic component 100 is polished with a mechanical polisher to a surface including an axis of symmetry (corresponding to the line X-X in FIG. 1B) in the top view of terminal electrode 2 to thereby expose a cross-section of ceramic electronic component 100. This cross-section is then subjected to flat milling treatment. After carbon coating treatment, element analysis is conducted with a wavelength dispersive X-ray (WDX) spectrometer (trademark JXA-8100 manufactured by JEOL Ltd.). Table 1 shows conditions for measurement with WDX.

TABLE 1

| Apparatus | | Condition |
|---|---|---|
| Electronic Optical System | Probe Current | $1 \times 10^{-7}$ A |
| | Acceleration Voltage | 15 KV |
| | Scanning Method | Stage Scanning (One Direction) |
| | Dwell Time | 50 ms |
| | The Number of Pixels | 250 × 250 |
| | Pixel Size | 0.6 μm |
| Spectroscope | Measurement X-Ray | Cu—Kα |
| | Dispersive Crystal | LiFH |

Intensity of Cu in the measurement results with WDX is subjected to ASCII conversion, and a site where a value for intensity of Cu is smaller than 400 is defined as boundary BD between ceramic insulator 1 and terminal electrode 2. In this embodiment, as will be described later, five types of terminal electrodes 2*a* to 2*e* in a square shape having lengths of one side of 30 μm, 50 μm, 100 μm, 1 mm, and 2 mm, respectively, are formed as evaluation-purpose ceramic electronic components 100A. In each terminal electrode, an interval between opposing sides is defined as an interval between two boundaries BD under the definition above.

In ceramic insulator 1, adjacent region 3 is higher in concentration of Ti or Al than remote region 4. The hatched portion in FIGS. 1A and 1B schematically shows that fact for ease of understanding in illustration, and cannot be identified based on a visual appearance of an actual ceramic insulator 1. Though adjacent region 3 is arranged in the hatched portion, that is, within a high-concentration region in FIGS. 1A and 1B, the high-concentration region may be located within adjacent region 3 without being limited to the shape shown in the drawings.

A specific experimental result will be described below for clarification. In the description below, a method of manufacturing a sample used for the experiment, that is, an evaluation-purpose ceramic electronic component 100A, is incorporated as the description of a method of manufacturing ceramic electronic component 100.

<First Step (Green Sheet Obtaining Step)>

Figure 2:
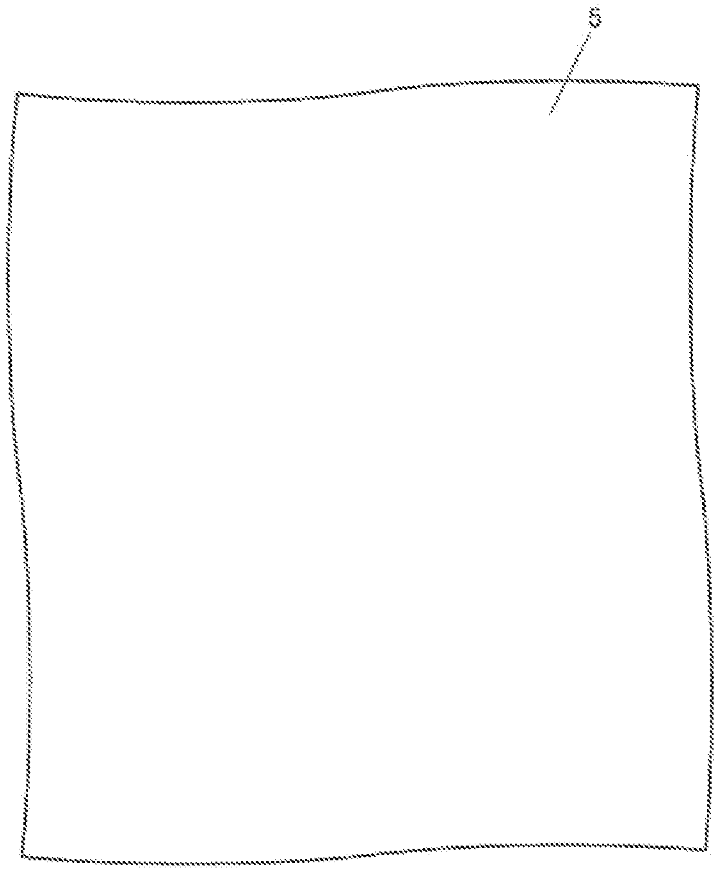
FIG. 2 is a diagram schematically showing a green sheet 5 prepared in a first step (green sheet obtaining step) for illustrating one example of a method of manufacturing an evaluation-purpose ceramic electronic component (ceramic wiring board) 100A.

A method of manufacturing evaluation-purpose ceramic electronic component 100A will be described with reference to FIGS. 2 to 6. FIG. 2 is a diagram schematically showing a green sheet 5 prepared in a first step (green sheet obtaining step).

A method of manufacturing green sheet 5 will be described. Powders of each of $SiO_2$, $Al_2O_3$, $BaCO_3$, $ZrO_2$, $TiO_2$, $Mg(OH)_2$, and $MnCO_3$ having a particle size not greater than 2.0 μm are prepared as starting source materials.

The starting source material powders are weighed to achieve a prescribed composition ratio, mixed with a wet method and crushed, and thereafter dried to obtain a mixture. Source material powders for green sheet 5 of a ceramic insulator are obtained by subjecting the obtained mixture to heat treatment for a prescribed time period (for example, within a range from 30 minutes to 300 minutes) at a prescribed temperature (for example, a range from 700° C. to 900° C.) in a reducing atmosphere. As a result of the heat treatment, $BaCO_3$ is converted to BaO, $Mg(OH)_2$ is converted to MgO, and $MnCO_3$ is converted to MnO.

Then, ceramic slurry is obtained by adding an organic binder, a dispersant, and a plasticizer to the source material powders for green sheet 5 and mixing and crushing the powders such that the source material powders have an average particle size ($D_{50}$) not greater than 1.5 μm. Then, green sheet 5 of which thickness after firing is adjusted to 20 μm is obtained by forming the ceramic slurry into a sheet on a substrate film with a doctor blade method followed by drying.

Using green sheet 5, a sintering start temperature $T_1$ (° C.) of a yet-to-be-fired ceramic insulator 7 (see FIG. 5) which will be described later and a ratio of shrinkage of a yet-to-be-fired ceramic electronic component 10A (see FIG. 5) in the direction of the main surface are determined. A type of a crystalline material generated after sintering of yet-to-be-fired ceramic insulator 7 is identified.

A method of measuring sintering start temperature $T_1$ (° C.) of yet-to-be-fired ceramic insulator 7 will be described. A sample for measuring a sintering start temperature of yet-to-be-fired ceramic insulator 7 is obtained by compression bonding ten green sheets 5. Then, a temperature of the sample is increased from a room temperature to 1000° C. at a rate of temperature increase of 2° C./minute with a thermo-mechanical analysis (TMA) apparatus (manufactured by the applicant company) controlled to achieve an atmosphere of $N_2/H_2O/H_2$ in which Cu is not oxidized.

In results of measurement with TMA, a ratio of shrinkage (%) in a direction of thickness is defined as $[(t_1-t_0)/t_0]\times 100$ where an initial thickness is denoted as to and a thickness at a certain temperature is denoted as $t_1$. A time point when the ratio of shrinkage in the direction of thickness attains to −10% is defined as the sintering start temperature. Consequently, sintering start temperature $T_1$ of yet-to-be-fired ceramic insulator 7 in the embodiment is 900° C.

A method of determining a ratio of shrinkage of yet-to-be-fired ceramic electronic component 10A in the direction of the main surface will be described. A sample for measuring a ratio of shrinkage of yet-to-be-fired ceramic electronic component 10A in the direction of the main surface is obtained by compression bonding green sheets 5 as many as above. A temperature of this sample is increased from a room temperature to a prescribed temperature (for example, a range from 900° C. to 1000° C.) at a prescribed rate of temperature increase (for example, within a range from 1° C./minute to 5° C./minute) with a firing furnace (manufactured by the applicant company) controlled to achieve an atmosphere where Cu is not oxidized (for example, an $N_2H_2O/H_2$ atmosphere), and the sample is held at that temperature for a prescribed time period (for example, a range from 60 minutes to 300 minutes) and thereafter cooled to the room temperature.

A ratio of shrinkage (%) of the sample in the direction of the main surface is defined as $[(L_1-L_0)/L_0]\times 100$ where a peripheral length of the yet-to-be-fired sample is denoted as $L_0$ and a peripheral length of the fired sample is denoted as $L_1$, and the ratio of shrinkage of the sample in the direction of the main surface is calculated. Consequently, the ratio of shrinkage in the direction of the main surface of yet-to-be-fired ceramic electronic component 10A in the embodiment is −5%.

Identification of a type of a crystalline material generated after sintering of yet-to-be-fired ceramic insulator 7 will now be described. A sample for identification of a type of a crystalline material is obtained by subjecting green sheets 5 which are cut in a similar shape to thermal compression bonding under the same conditions as above. A temperature of the sample is increased from a room temperature to a prescribed temperature (for example, a range from 900° C. to 1000° C.) at a prescribed rate of temperature increase (for example, within a range from 1° C./minute to 5° C./minute) with a firing furnace (manufactured by the applicant company) controlled to achieve an atmosphere where Cu is not oxidized (for example, an $N_2/H_2O/H_2$ atmosphere), and the sample is held at that temperature for a prescribed time period (for example, a range from 60 minutes to 300 minutes) and thereafter cooled to the room temperature. The fired sample is crushed into a powder.

The powder sample is subjected to X-ray diffraction with a diffractometer with Cu-Kα rays used as measurement X-rays. Consequently, the crystalline material generated after sintering of yet-to-be-fired ceramic insulator 7 in the embodiment is identified as $SiO_2$, $Al_2O_3$, celsian, and fresnoite.

<Second Step (Conductor Paste Obtaining Step)>

Obtaining a conductor paste to be used for forming yet-to-be-fired terminal electrodes 6*a* to 6*e* on green sheet 5 in a third step (yet-to-be-fired terminal electrode forming step which will be described later) will now be described. Metal powders shown in Table 2, oxide powders shown in Table 3, an organic compound shown in Table 4, and an organic vehicle containing an ethyl cellulose resin are prepared as starting source materials.

TABLE 2

| Metal Powder Type Number | Type | $D_{50}$ (μm) | True Specific Gravity |
|---|---|---|---|
| K-1 | Cu | 1.5 | 8.87 |

TABLE 3

| | Oxide Powder Type Number | Type | True Specific Gravity | SSA ($m^2/g$) |
|---|---|---|---|---|
| | Al-1 | $TiO_2$ | 3.7 | 5 |
| | Al-2 | $TiO_2$ | 3.7 | 10 |
| | Al-3 | $TiO_2$ | 3.7 | 30 |
| | Al-4 | $TiO_2$ | 3.7 | 90 |
| | Al-5 | $Al_2O_3$ | 3.9 | 10 |
| * | Al-6 | $SiO_2$ | 2.6 | 10 |
| * | Al-7 | $Mn_3O_4$ | 4.9 | 10 |
| * | Al-8 | $ZrO_2$ | 5.8 | 10 |

* indicates being out of the range of this invention.

TABLE 4

| Organic Compound Type Number | Type | Metal Content* (wt %) | True Specific Gravity |
|---|---|---|---|
| AO-1 | Organic Titanium Compound | 10 | 0.95 |
| AO-2 | Organic Aluminum Compound | 10 | 0.95 |

*Percentage with mass of organic compound being defined as denominator and mass of contained metal being defined as numerator $D_{50}$ in Table 2 is measured with a laser diffraction/scattering particle size distribution analyzer (LA series manufactured by Horiba Ltd.) A mixture of ethyl alcohol and isopropyl alcohol is employed as a measurement solvent. A specific surface area (SSA) in Tables 3 and 4 is measured with an SSA measurement apparatus (a trademark Macsorb® manufactured by Mountech Co., Ltd.) with the Brunauer, Emmet and Teller's equation (BET) single-point method with the use of $N_2$ gas.

A true specific gravity in Tables 2 and 3 is measured with a dry automatic density meter (a trademark Acupic® series manufactured by Shimadzu Corporation) with the use of He gas, and a true specific gravity in Table 4 is measured with a specific gravity cup (manufactured by Yasuda Seiki Seisakusho, Ltd.). A metal content in Table 4 is measured with an inductively coupled plasma atomic emission spectrometer (ICP-AES manufactured by Shimadzu Corporation).

Conductor pastes labeled with conductor paste composition numbers P-1 to P-18 are obtained by blending starting source materials shown in Tables 2 to 4 to achieve a composition ratio shown in Table 5 and dispersing the starting source materials with a triple roll mill.

<Fourth Step (Green Sheet Layering Step)>

Figure 4:
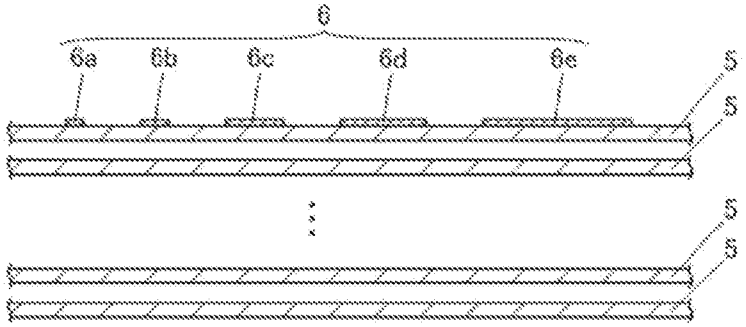
FIG. 4 is a diagram similarly schematically showing a process of layering green sheets 5 including the green sheet having yet-to-be-fired terminal electrodes 6*a* to 6*e* formed in a fourth step (green sheet layering step).

FIG. 4 is a diagram schematically showing a process of layering green sheets 5 including the green sheet having yet-to-be-fired terminal electrodes 6*a* to 6*e* formed in a fourth step (green sheet layering step). At this time, a prescribed number of green sheets are layered such that yet-to-be-fired terminal electrodes 6*a* to 6*e* do not lie between green sheets 5, that is, yet-to-be-fired terminal electrodes 6*a* to 6*e* are arranged at the top as shown in FIG. 4.

Figure 5:
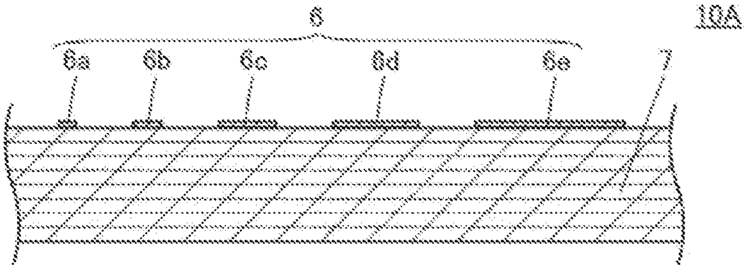
FIG. 5 is a diagram similarly schematically showing a yet-to-be-fired ceramic electronic component 10A obtained in the fourth step (green sheet layering step).

FIG. 5 is a diagram similarly schematically showing yet-to-be-fired ceramic electronic component 10A obtained in the fourth step (green sheet layering step). Yet-to-be-fired ceramic electronic component 10A is obtained by compression bonding green sheets 5 layered as above and including the green sheet having yet-to-be-fired terminal electrodes 6*a* to 6*e* formed. Yet-to-be-fired ceramic electronic component 10A includes yet-to-be-fired ceramic insulator 7 and yet-to-be-tired terminal electrodes 6*a* to 6*e*.

<Fifth Step (Firing Step)>

A firing step of obtaining evaluation-purpose ceramic electronic component 100A by firing yet-to-be-fired ceramic electronic component 10A obtained in the fourth step will be

TABLE 5

| | Conductor Paste Composition | Composition (Vol %) | | | | | | | | | | | |
|---|---|---|---|---|---|---|---|---|---|---|---|---|---|
| | | Metal Powders | Additive | | | | | | | | | | |
| | | | Oxide Powders | | | | | | | | Organic Compound | | |
| | Number | K-1 | AI-1 | AI-2 | AI-3 | AI-4 | AI-5 | AI-6 | AI-7 | AI-8 | AO-1 | AO-2 | Organic Vehicle |
| | P-1 | 39.2 | — | 0.8 | — | — | — | — | — | — | — | — | 60.0 |
| | P-2 | 38.4 | — | 1.6 | — | — | — | — | — | — | — | — | 60.0 |
| | P-3 | 36.0 | — | 4.0 | — | — | — | — | — | — | — | — | 60.0 |
| | P-4 | 34.0 | — | 6.0 | — | — | — | — | — | — | — | — | 60.0 |
| | P-5 | 36.8 | 3.2 | — | — | — | — | — | — | — | — | — | 60.0 |
| | P-6 | 39.2 | — | — | 0.8 | — | — | — | — | — | — | — | 60.0 |
| | P-7 | 39.6 | — | — | — | 0.4 | — | — | — | — | — | — | 60.0 |
| | P-8 | 38.4 | — | — | — | — | 1.6 | — | — | — | — | — | 60.0 |
| | P-9 | 34.0 | — | — | — | — | 6.0 | — | — | — | — | — | 60.0 |
| * | P-10 | 38.4 | — | — | — | — | — | 1.6 | — | — | — | — | 60.0 |
| * | P-11 | 34.0 | — | — | — | — | — | 6.0 | — | — | — | — | 60.0 |
| * | P-12 | 38.4 | — | — | — | — | — | — | 1.6 | — | — | — | 60.0 |
| * | P-13 | 34.0 | — | — | — | — | — | — | 6.0 | — | — | — | 60.0 |
| * | P-14 | 38.4 | — | — | — | — | — | — | — | 1.6 | — | — | 60.0 |
| * | P-15 | 34.0 | — | — | — | — | — | — | — | 6.0 | — | — | 60.0 |
| * | P-16 | 40.0 | — | — | — | — | — | — | — | — | — | — | 60.0 |
| | P-17 | 38.4 | — | — | — | — | — | — | — | — | 16.0 | — | 45.6 |
| | P-18 | 38.4 | — | — | — | — | — | — | — | — | — | 16.0 | 45.6 |

* indicates being out of the range of this invention.

<Third Step (Yet-To-Be-Fired Terminal Electrode Forming Step)>

Figure 3:
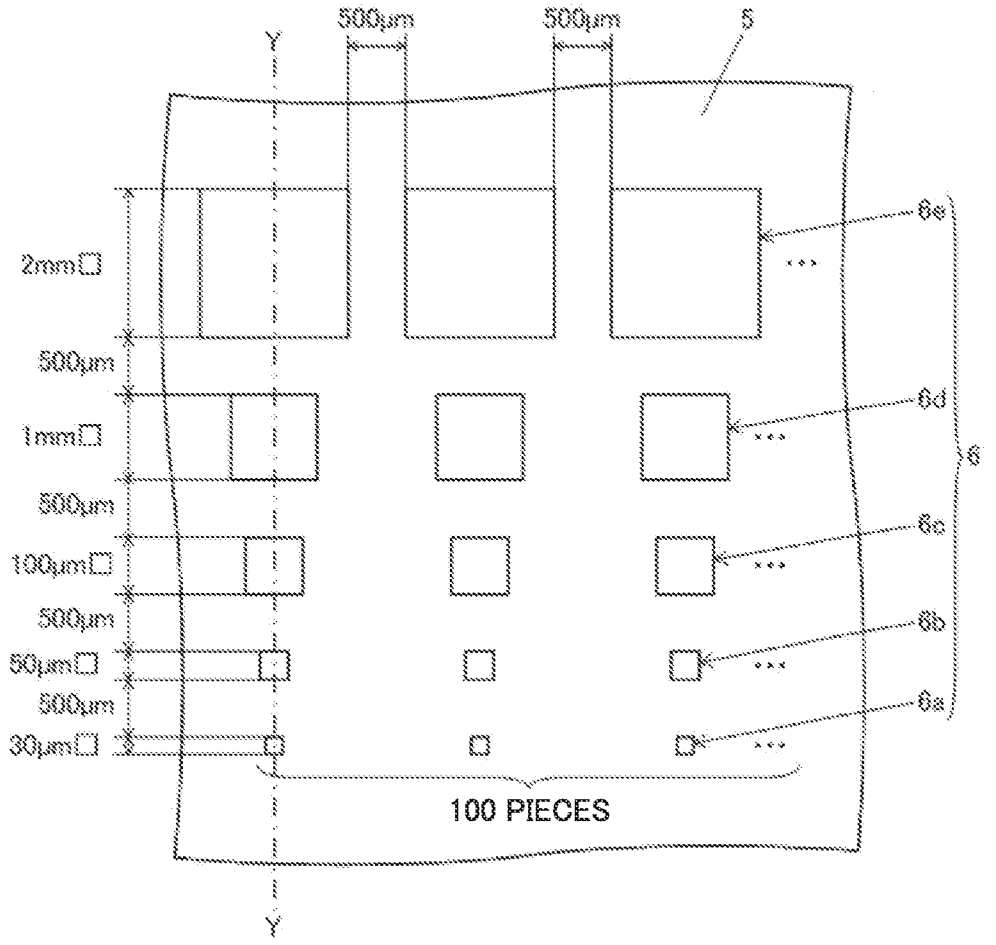
FIG. 3 is a diagram similarly schematically showing green sheet 5 having yet-to-be-fired terminal electrodes 6*a* to 6*e* of various sizes formed in a third step (yet-to-be-fired terminal electrode forming step) with a conductor paste obtained in a second step (conductor paste obtaining step).

FIG. 3 is a diagram schematically showing green sheet 5 having yet-to-be-fired terminal electrodes 6*a* to 6*e* formed in a third step (yet-to-be-fired terminal electrode forming step). Yet-to-be-fired terminal electrodes 6*a* to 6*e* are formed in a square shape having lengths of one side of 30 μm, 50 μm, 100 μM, 1 mm, and 2 mm, respectively, after firing as described previously. One hundred pieces of each of yet-to-be-fired terminal electrodes 6*a* to 6*e* are formed on one green sheet such that an interval thereamong after firing is set to 500 μm.

Green sheet 5 shown in FIG. 3 is obtained by printing on green sheet 5, the conductor paste obtained in the second step (conductor paste obtaining step) into a shape shown in FIG. 3 with a screen printing method.

described. The step of firing yet-to-be-fired ceramic electronic component 10A includes four sub steps below.

A raw multilayer body is subjected to heat treatment under a prescribed condition in a reducing atmosphere in order to decompose an organic binder contained in yet-to-be-fired ceramic insulator 7 and yet-to-be-fired terminal electrodes 6*a* to 6*e* (a first sub step). When yet-to-be-fired terminal electrodes 6*a* to 6*e* contain an organic compound containing a metal (conductor paste composition numbers P-17 and P-18), the organic compound is converted to a metal oxide through this step.

After the first sub step, heat treatment under a prescribed condition in a reducing atmosphere is performed such that remaining C contained in yet-to-be-fired ceramic electronic component 10A is lower than 0.1 wt % (a second sub step).

After the second sub step, heat treatment under a prescribed condition in a reducing atmosphere is performed. In this step, yet-to-be-fired ceramic insulator 7 is converted to ceramic insulator 1 comprising a glass ceramic containing a crystalline material and an amorphous material. Yet-to-be-fired terminal electrodes 6$a$ to 6$e$ are converted to terminal electrodes 2$a$ to 2$e$. A product resulting from partial reduction of an oxide contained in yet-to-be-fired terminal electrodes 6$a$ to 6$e$ through burning of remaining C in the second sub step is sufficiently oxidized again (a third sub step).

After the third sub step, in order to diffuse the oxide in terminal electrodes 2$a$ to 2$e$ into the amorphous material in ceramic insulator 1, heat treatment under a prescribed condition in a reducing atmosphere is performed (a fourth sub step). After the glass ceramic forming step, a temperature is increased at a rate of temperature increase of 2° C./minute up to 980° C. higher by 80° C. than sintering start temperature $T_1$ of yet-to-be-fired ceramic insulator 7, and the temperature is held for two hours. At this time, by controlling a flow rate of $N_2/H_2/H_2O/O_2$, an atmosphere is controlled to an atmosphere in which Cu is reduced but the oxide contained in yet-to-be-fired terminal electrodes 6$a$ to 6$e$ maintains the oxidized state. In this step, the oxide in terminal electrodes 2$a$ to 2$e$ is diffused into the amorphous material in ceramic insulator 1. Consequently, a concentration in the adjacent region surrounding terminal electrodes 2$a$ to 2$e$, of the metal element contained in common in the crystalline material in ceramic insulator 1 and terminal electrodes 2$a$ to 2$e$ is higher than a concentration thereof in remote region 4.

Figure 6:
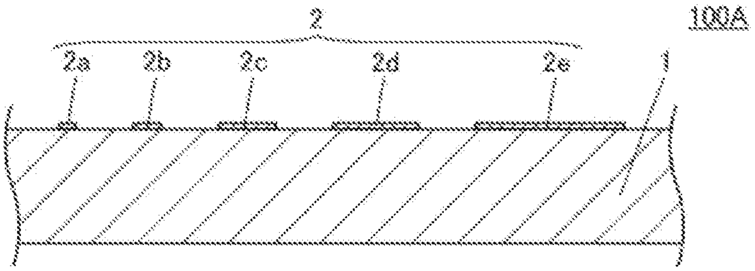
FIG. 6 is a diagram similarly schematically showing evaluation-purpose ceramic electronic component 100A obtained in a fifth step (firing step).

FIG. 6 is a diagram schematically showing evaluation-purpose ceramic electronic component 100A including ceramic insulator 1 and terminal electrodes 2$a$ to 2$e$ obtained in the step above. FIG. 6 does not show the adjacent region.

A type of the crystalline material in ceramic insulator 1 of evaluation-purpose ceramic electronic component 100A obtained as above is identified, a composition of the amorphous material therein is analyzed, and a basicity of the amorphous material therein is calculated. Table 6 shows results thereof. Analytical specimen numbers (S-1 to S-18) corresponding to types of the conductor paste are allocated to evaluation-purpose ceramic electronic components 100A subjected to various types of evaluation.

A method of identifying a type of the crystalline material in ceramic insulator 1 will be described. Initially, evaluation-purpose ceramic electronic component 100A is polished with a mechanical polisher to a surface including an axis of symmetry (corresponding to the line Y-Y in FIG. 3) in the top view of terminal electrode 2 to thereby expose a cross-section of evaluation-purpose ceramic electronic component 100A. This cross-section is then subjected to flat milling treatment. A thin piece is obtained by subjecting a portion in the cross-section of evaluation-purpose ceramic electronic component 100A which is distant by 100 μm from boundary BD between ceramic insulator 1 and terminal electrodes 2$a$ to 2$e$ defined as described previously to focused ion beam (FIB) processing.

The obtained thin piece is analyzed with a scanning transmission electron microscope (STEM/a trademark HD-2300A manufactured by Hitachi Ltd.) and energy dispersive analysis of X-ray (EDAX/a trademark Genesis XM4 manufactured by AMETEK Inc.) so as to examine presence of the crystalline material. Furthermore, a site identified as the crystalline material is subjected to selected area electron diffraction with the use of a field-emission type transmission electron microscope (FE-TEM/a trademark JEM-2200FS manufactured by JEOL Ltd.) so as to calculate various spacings between crystals based on an obtained diffraction pattern and so as to identify the crystalline material matching with the spacing. Table 7 shows conditions for analysis with STEM/EDAX. Results obtained as above are shown in the field of type of crystalline oxide in Table 6.

TABLE 7

| Apparatus | Condition | |
|---|---|---|
| STEM | Acceleration Voltage | 200 kV |
| | Variable Aperture of Objective | #2 |
| | Probe Diameter | Normal Mode |
| | Pre-Treatment | Pt Coating |
| EDX | Time Constant | 12.8 μs |
| | The Number of Map Integrations | 16 |
| | Dwell Time | 500 |

TABLE 6

| | | | Composition of Glass Ceramic in Portion Distant by 250 μm from Terminal Electrode | | | | | | | | |
|---|---|---|---|---|---|---|---|---|---|---|---|
| | | | | Amorphous Oxide | | | | | | | |
| Analytical Specimen Number | Conductor Paste | Crystalline Oxide Type | Composition (mol %) | | | | | | | | |
| | | | $SiO_2$ | BaO | MnO | $Al_2O_3$ | $TiO_2$ | $ZrO_2$ | MgO | Basicity |
| S-1 | P-1 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| S-2 | P-2 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| S-3 | P-3 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| S-4 | P-4 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| S-5 | P-5 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| S-6 | P-6 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| S-7 | P-7 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| S-8 | P-8 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| S-9 | P-9 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| * S-10 | P-10 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| * S-11 | P-11 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| * S-12 | P-12 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| * S-13 | P-13 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| * S-14 | P-14 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| * S-15 | P-15 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| * S-16 | P-16 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| S-17 | P-17 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |
| S-18 | P-18 | $SiO_2$, $Al_2O_3$, $BaAl_2Si_2O_8$, $Ba_2TiSi_2O_8$ | 82.89 | 6.96 | 3.34 | 2.41 | 2.06 | 1.32 | 1.02 | 0.1427 |

* indicates being out of the range of this invention.

A method of analyzing a composition of the amorphous material in ceramic insulator 1 will be described. A thin piece obtained as in identification of a type of the crystalline material is subjected to analysis with EDX with the use of STEM/EDAX so as to analyze the composition of the amorphous material. Results obtained as above are shown in the field of type of amorphous oxide in Table 6.

Basicity B of the amorphous material is calculated in accordance with expressions (1) to (3) below based on the composition of the amorphous material obtained through analysis with EDX. Results obtained as above are shown in the field of basicity in Table 6.

$$B=\sum_{i} n_i B(Mi-O) \tag{1}$$

$$B(Mi-O)=\frac{B(Mi-O_0)-B(Si-O_0)}{B(Ca-O_0)-B(Si-O_0)} \tag{2}$$

$$B(Mi-O_0)=\frac{(r_{Mi}+1.4)^2}{2Z_{Mi}} \tag{3}$$

In the expressions, B(Mi-O) represents a basicity of each oxide in the terminal electrode (a cation being expressed as Mi), B(Mi-$O_0$) represents oxygen donation capability of MiO when an oxide of a certain element is expressed as MiO, B(Si—$O_0$) represents oxygen donation capability of $SiO_2$, B(Ca—$O_0$) represents oxygen donation capability of CaO, $n_i$ represents a composition ratio of each cation Mi, $r_{Mi}$, represents an ion radius (Å) of each cation Mi, and $Z_{Mi}$ represents a valence of each cation Mi. B(Mi-O) is calculated by using a value of an ion radius according to Pauling as a value of an ion radius of each cation Mi and obtained by rounding a calculated value off to four decimal places.

Since there is only one type of oxide powder in the terminal electrode as shown in Table 3 in the experimental example herein, a condition of B=B(Mi-O) is satisfied. Alternatively, a plurality of types of oxide powders mixed together may be used. For example, $TiO_2$ and $Al_2O_3$ can be mixed and used as oxide powders in the terminal electrode. In that case, a condition of $B=n_{Ti}B_{Ti\text{-}O}+n_{Al\text{-}O}B_{Al\text{-}O}$ ($n_{Ti}+n_{Al}=1$) is satisfied.

A type of the oxide in terminal electrodes 2*a* to 2*e* of evaluation-purpose ceramic electronic component 100A obtained as above is identified and a basicity of the oxide is calculated. Table 8 shows results.

TABLE 8

| Analytical Specimen Number | Conductor Paste | Composition of Crystalline Oxide in Terminal Electrode: Type 30 μm□ | Type 50 μm□ | Type 100 μm□ | Type 1 mm□ | Type 2 mm□ | Basicity 30 μm□ | Basicity 50 μm□ | Basicity 100 μm□ | Basicity 1 mm□ | Basicity 2 mm□ |
|---|---|---|---|---|---|---|---|---|---|---|---|
| S-1 | P-1 | $TiO_2$ | $TiO_2$ | $TiO_2$ | $TiO_2$ | $TiO_2$ | 0.1250 | 0.1250 | 0.1250 | 0.1250 | 0.1250 |
| S-2 | P-2 | $TiO_2$ | $TiO_2$ | $TiO_2$ | $TiO_2$ | $TiO_2$ | 0.1250 | 0.1250 | 0.1250 | 0.1250 | 0.1250 |
| S-3 | P-3 | $TiO_2$ | $TiO_2$ | $TiO_2$ | $TiO_2$ | $TiO_2$ | 0.1250 | 0.1250 | 0.1250 | 0.1250 | 0.1250 |
| S-4 | P-4 | $TiO_2$ | $TiO_2$ | $TiO_2$ | $TiO_2$ | $TiO_2$ | 0.1250 | 0.1250 | 0.1250 | 0.1250 | 0.1250 |
| S-5 | P-5 | $TiO_2$ | $TiO_2$ | $TiO_2$ | $TiO_2$ | $TiO_2$ | 0.1250 | 0.1250 | 0.1250 | 0.1250 | 0.1250 |
| S-6 | P-6 | $TiO_2$ | $TiO_2$ | $TiO_2$ | $TiO_2$ | $TiO_2$ | 0.1250 | 0.1250 | 0.1250 | 0.1250 | 0.1250 |
| S-7 | P-7 | $TiO_2$ | $TiO_2$ | $TiO_2$ | $TiO_2$ | $TiO_2$ | 0.1250 | 0.1250 | 0.1250 | 0.1250 | 0.1250 |
| S-8 | P-8 | $Al_2O_3$ | $Al_2O_3$ | $Al_2O_3$ | $Al_2O_3$ | $Al_2O_3$ | 0.1913 | 0.1913 | 0.1913 | 0.1913 | 0.1913 |
| S-9 | P-9 | $Al_2O_3$ | $Al_2O_3$ | $Al_2O_3$ | $Al_2O_3$ | $Al_2O_3$ | 0.1913 | 0.1913 | 0.1913 | 0.1913 | 0.1913 |
| * S-10 | P-10 | $SiO_2$ | $SiO_2$ | $SiO_2$ | $SiO_2$ | $SiO_2$ | 0 | 0 | 0 | 0 | 0 |
| * S-11 | P-11 | $SiO_2$ | $SiO_2$ | $SiO_2$ | $SiO_2$ | $SiO_2$ | 0 | 0 | 0 | 0 | 0 |
| * S-12 | P-12 | MnO | MnO | MnO | MnO | MnO | 0.7850 | 0.7850 | 0.7850 | 0.7850 | 0.7850 |
| * S-13 | P-13 | MnO | MnO | MnO | MnO | MnO | 0.7850 | 0.7850 | 0.7850 | 0.7850 | 0.7850 |
| * S-14 | P-14 | $ZrO_2$ | $ZrO_2$ | $ZrO_2$ | $ZrO_2$ | $ZrO_2$ | 0.1829 | 0.1829 | 0.1829 | 0.1829 | 0.1829 |
| * S-15 | P-15 | $ZrO_2$ | $ZrO_2$ | $ZrO_2$ | $ZrO_2$ | $ZrO_2$ | 0.1829 | 0.1829 | 0.1829 | 0.1829 | 0.1829 |
| * S-16 | P-16 | — | — | — | — | — | — | — | — | — | — |
| S-17 | P-17 | $TiO_2$ | $TiO_2$ | $TiO_2$ | $TiO_2$ | $TiO_2$ | 0.1250 | 0.1250 | 0.1250 | 0.1250 | 0.1250 |
| S-18 | P-18 | $Al_2O_3$ | $Al_2O_3$ | $Al_2O_3$ | $Al_2O_3$ | $Al_2O_3$ | 0.1913 | 0.1913 | 0.1913 | 0.1913 | 0.1913 |

* indicates being out of the range of this invention.

A method of identifying a type of the oxide in terminal electrodes 2*a* to 2*e* will be described. Initially, evaluation-purpose ceramic electronic component 100A is polished with a mechanical polisher to a surface including the axis of symmetry (corresponding to the line Y-Y in FIG. 3) in the top view of terminal electrodes 2*a* to 2*e* to thereby expose a cross-section of evaluation-purpose ceramic electronic component 100A. This cross-section is then subjected to flat milling treatment. A region in terminal electrodes 2*a* to 2*e* distant by 10 μm or more from the main surface of evaluation-purpose ceramic electronic component 100A in the cross-section of evaluation-purpose ceramic electronic component 100A is formed into a thin piece through FIB processing.

A type of the oxide scattered over the region in the obtained thin piece is identified with a method the same as the method of identifying a type of the crystalline material in ceramic insulator 1 described previously. Consequently, the detected oxide is confirmed as being crystalline and being composed substantially of a single component. Results obtained as above are shown in the field of type of crystalline oxide in terminal electrode in Table 8.

Basicity B of the oxide confirmed above is calculated in accordance with the expressions (1) to (3) described previously. Results obtained above are shown in the field of basicity of crystalline oxide in terminal electrode in Table 8.

Interaction between ceramic insulator 1 and terminal electrodes 2*a* to 2*e* is analyzed based on results of analysis of ceramic insulator 1 and terminal electrodes 2*a* to 2*e*. Table 9 shows results.

TABLE 9

| Analytical Specimen Number | Conductor Paste | Element in Common | Difference in Basicity 30 μm□ | 50 μm□ | 100 μm□ | 1 mm□ | 2 mm□ |
|---|---|---|---|---|---|---|---|
| S-1 | P-1 | Ti | 0.018 | 0.018 | 0.018 | 0.018 | 0.018 |
| S-2 | P-2 | Ti | 0.018 | 0.018 | 0.018 | 0.018 | 0.018 |
| S-3 | P-3 | Ti | 0.018 | 0.018 | 0.018 | 0.018 | 0.018 |
| S-4 | P-4 | Ti | 0.018 | 0.018 | 0.018 | 0.018 | 0.018 |
| S-5 | P-5 | Ti | 0.018 | 0.018 | 0.018 | 0.018 | 0.018 |
| S-6 | P-6 | Ti | 0.018 | 0.018 | 0.018 | 0.018 | 0.018 |
| S-7 | P-7 | Ti | 0.018 | 0.018 | 0.018 | 0.018 | 0.018 |
| S-8 | P-8 | Al | 0.049 | 0.049 | 0.049 | 0.049 | 0.049 |
| S-9 | P-9 | Al | 0.049 | 0.049 | 0.049 | 0.049 | 0.049 |
| * S-10 | P-10 | Si | 0.143 | 0.143 | 0.143 | 0.143 | 0.143 |
| * S-11 | P-11 | Si | 0.143 | 0.143 | 0.143 | 0.143 | 0.143 |
| * S-12 | P-12 | None | 0.642 | 0.642 | 0.642 | 0.642 | 0.642 |
| * S-13 | P-13 | None | 0.642 | 0.642 | 0.642 | 0.642 | 0.642 |
| * S-14 | P-14 | None | 0.040 | 0.040 | 0.040 | 0.040 | 0.040 |
| * S-15 | P-15 | None | 0.040 | 0.040 | 0.040 | 0.040 | 0.040 |
| * S-16 | P-16 | None | — | — | — | — | — |
| S-17 | P-17 | Ti | 0.018 | 0.018 | 0.018 | 0.018 | 0.018 |
| S-18 | P-18 | Al | 0.049 | 0.049 | 0.049 | 0.049 | 0.049 |

* indicates being out of the range of this invention.

The metal element contained in common in the amorphous material in ceramic insulator 1 and the oxide in terminal electrodes 2*a* to 2*e* is shown in the field of element in common in Table 9. An absolute value of a difference in basicity between the amorphous material in ceramic insulator 1 and the oxide in terminal electrodes 2*a* to 2*e* is shown in the field of difference in basicity in Table 9. A difference in basicity is obtained by rounding a calculated value off to three decimal places.

A concentration of the element in common in the adjacent region surrounding terminal electrodes 2*a* to 2*e* in ceramic insulator 1 and a concentration of the element in common in the remote region are analyzed. The crystalline material containing the element in common which is present in the adjacent region is identified. Table 10 shows results.

A method of analyzing a concentration of the element in common in the adjacent region and a concentration of the element in common in the remote region will be described. Initially, evaluation-purpose ceramic electronic component 100A is polished with a mechanical polisher to a surface including the axis of symmetry (corresponding to the line Y-Y in FIG. 3) in the top view of terminal electrodes 2*a* to 2*e* to thereby expose a cross-section of evaluation-purpose ceramic electronic component 100A. This cross-section is then subjected to flat milling treatment. After carbon coating treatment, element analysis is conducted with a wavelength dispersive X-ray (WDX) spectrometer (a trademark JXA-8100 manufactured by JEOL Ltd.) to thereby check a concentration of the element in common. Conditions for measurement with WDX are the same as shown in Table 1.

Then, a concentration of the element in common in the adjacent region is compared with a concentration of the element in common in the remote region. When the concentration of the element in common in the adjacent region

TABLE 10

| | | Adjacent Region | | | | | | | | | |
|---|---|---|---|---|---|---|---|---|---|---|---|
| | | 30 μm□ | | 50 μm□ | | 100 μm□ | | 1 mm□ | | 2 mm□ | |
| Analytical Specimen Number | Conductor Paste | Element in Common | Crystalline Oxide | Element in Common | Crystalline Oxide | Element in Common | Crystalline Oxide | Element in Common | Crystalline Oxide | Element in Common | Crystalline Oxide |
| S-1 | P-1 | ○ | $Ba_2TiSi_2O_8$ | ○ | $Ba_2TiSi_2O_8$ | ○ | $Ba_2TiSi_2O_8$ | ○ | $Ba_2TiSi_2O_8$ | ○ | $Ba_2TiSi_2O_8$ |
| S-2 | P-2 | ○ | $Ba_2TiSi_2O_8$ | ○ | $Ba_2TiSi_2O_8$ | ○ | $Ba_2TiSi_2O_8$ | ○ | $Ba_2TiSi_2O_8$ | ○ | $Ba_2TiSi_2O_8$ |
| S-3 | P-3 | ○ | $Ba_2TiSi_2O_8$ | ○ | $Ba_2TiSi_2O_8$ | ○ | $Ba_2TiSi_2O_8$ | ○ | $Ba_2TiSi_2O_8$ | ○ | $Ba_2TiSi_2O_8$ |
| S-4 | P-4 | ○ | $Ba_2TiSi_2O_8$ | ○ | $Ba_2TiSi_2O_8$ | ○ | $Ba_2TiSi_2O_8$ | ○ | $Ba_2TiSi_2O_8$ | ○ | $Ba_2TiSi_2O_8$ |
| S-5 | P-5 | ○ | $Ba_2TiSi_2O_8$ | ○ | $Ba_2TiSi_2O_8$ | ○ | $Ba_2TiSi_2O_8$ | ○ | $Ba_2TiSi_2O_8$ | ○ | $Ba_2TiSi_2O_8$ |
| S-6 | P-6 | ○ | $Ba_2TiSi_2O_8$ | ○ | $Ba_2TiSi_2O_8$ | ○ | $Ba_2TiSi_2O_8$ | ○ | $Ba_2TiSi_2O_8$ | ○ | $Ba_2TiSi_2O_8$ |
| S-7 | P-7 | ○ | $Ba_2TiSi_2O_8$ | ○ | $Ba_2TiSi_2O_8$ | ○ | $Ba_2TiSi_2O_8$ | ○ | $Ba_2TiSi_2O_8$ | ○ | $Ba_2TiSi_2O_8$ |
| S-8 | P-8 | ○ | $BaAl_2Si_2O_8$ | ○ | $BaAl_2Si_2O_8$ | ○ | $BaAl_2Si_2O_8$ | ○ | $BaAl_2Si_2O_8$ | ○ | $BaAl_2Si_2O_8$ |
| S-9 | P-9 | ○ | $BaAl_2Si_2O_8$ | ○ | $BaAl_2Si_2O_8$ | ○ | $BaAl_2Si_2O_8$ | ○ | $BaAl_2Si_2O_8$ | ○ | $BaAl_2Si_2O_8$ |
| * S-10 | P-10 | x | — | x | — | x | — | x | — | x | — |
| * S-11 | P-11 | x | — | x | — | x | — | x | — | x | — |
| * S-12 | P-12 | x | — | x | — | x | — | x | — | x | — |
| * S-13 | P-13 | x | — | x | — | x | — | x | — | x | — |
| * S-14 | P-14 | x | — | x | — | x | — | x | — | x | — |
| * S-15 | P-15 | x | — | x | — | x | — | x | — | x | — |
| * S-16 | P-16 | x | $Ba_2TiSi_2O_8$ | x | $Ba_2TiSi_2O_8$ | x | $Ba_2TiSi_2O_8$ | x | $Ba_2TiSi_2O_8$ | x | $Ba_2TiSi_2O_8$ |
| S-17 | P-17 | ○ | $Ba_2TiSi_2O_8$ | ○ | $Ba_2TiSi_2O_8$ | ○ | $Ba_2TiSi_2O_8$ | ○ | $Ba_2TiSi_2O_8$ | ○ | $Ba_2TiSi_2O_8$ |
| S-18 | P-18 | ○ | $BaAl_2Si_2O_8$ | ○ | $BaAl_2Si_2O_8$ | ○ | $BaAl_2Si_2O_8$ | ○ | $BaAl_2Si_2O_8$ | ○ | $BaAl_2Si_2O_8$ |

* indicates being out of the range of this invention.

is higher, a circle is shown in the field of element in common in Table 10. When a concentration of the element in common in the adjacent region is equal to or lower than the concentration of the element in common in the remote region, a cross is shown in the field of element in common in Table 10.

A method of identifying the crystalline material containing the element in common which is present in the adjacent region will be described. A type of the oxide scattered over the adjacent region higher in concentration of the element in common as a result of analysis above is identified with a method the same as the method of identifying a type of the crystalline material in ceramic insulator 1 described previously. Results obtained above are shown in the field of type of crystalline oxide in adjacent region in Table 10.

Adhesion of plating of an outer surface of terminal electrodes 2*a* to 2*e*, separation between ceramic insulator 1 and terminal electrodes 2*a* to 2*e*, and denseness of terminal electrodes 2*a* to 2*e* are evaluated. Table 11 shows results.

immersed in a fluorescent solution. After the treatment for immersion in the fluorescent solution, the evaluation-purpose ceramic electronic component is dried for ten minutes at 150° C. with a hot air drier. Then, evaluation-purpose ceramic electronic component 100A is polished with a mechanical polisher to a surface including the axis of symmetry (corresponding to the line Y-Y in FIG. 3) in the top view of terminal electrodes 2*a* to 2*e* to thereby expose a cross-section of evaluation-purpose ceramic electronic component 100A. The cross-section is observed with a fluorescent microscope and whether or not a portion between ceramic insulator 1 and terminal electrodes 2*a* to 2*e* is impregnated with the fluorescent solution is observed. The number of measurement samples is set to ten for each of terminal electrodes 2*a* to 2*e*.

Among the ten samples for each of terminal electrodes 2*a* to 2*e*, specimens none of which is impregnated with the fluorescent solution in the portion between ceramic insulator 1 and each terminal electrode are determined as being free

TABLE 11

| Analytical Specimen Number | Conductor Paste | Evaluation Result | | | | | | | |
|---|---|---|---|---|---|---|---|---|---|
| | | Adhesion of Plating | | | | | | | Comprehensive |
| | | 30 μm | 50 μm | 100 μm | 1 mm | 2 mm | Separation | Denseness | Evaluation |
| S-1 | P-1 | A | A | A | A | A | A | S | A |
| S-2 | P-2 | S | S | S | S | S | A | S | S |
| S-3 | P-3 | S | S | S | S | S | A | S | S |
| S-4 | P-4 | A | A | A | A | A | A | A | A |
| S-5 | P-5 | S | S | S | S | S | A | S | S |
| S-6 | P-6 | S | S | S | S | S | A | S | S |
| S-7 | P-7 | S | S | S | S | S | A | S | S |
| S-8 | P-8 | A | A | A | A | A | A | S | A |
| S-9 | P-9 | A | A | A | A | A | A | A | A |
| * S-10 | P-10 | B | B | B | B | B | A | S | B |
| * S-11 | P-11 | B | B | B | B | B | A | A | B |
| * S-12 | P-12 | B | B | B | B | B | A | S | B |
| * S-13 | P-13 | B | B | B | B | B | A | A | B |
| * S-14 | P-14 | B | B | B | B | B | A | S | B |
| * S-15 | P-15 | B | B | B | B | B | A | A | B |
| S-16 | P-16 | B | A | A | S | S | B | S | B |
| S-17 | P-17 | S | S | S | S | S | A | S | S |
| S-18 | P-18 | A | A | A | A | A | A | S | A |

* indicates being out of the range of this invention.

A method of evaluating adhesion of plating of terminal electrodes 2*a* to 2*e* will be described. Terminal electrodes 2*a* to 2*e* are subjected to electroless Ni plating treatment. After the plating treatment, a thickness of Ni plating on the surface of an end portion of each of terminal electrodes 2*a* to 2*e* is measured with fluorescent X-rays. The number of samples subjected to measurement is set to one hundred for each of terminal electrodes 2*a* to 2*e*.

An average value of thicknesses of Ni platings for each of terminal electrodes 2*a* to 2*e* is calculated, and a specimen of which thickness of Ni plating exceeds 4 μm is determined as being particularly good in adhesion of Ni plating and "S" is shown in the field of adhesion of plating in evaluation result in Table 11. A specimen of which thickness of Ni plating is not smaller than 1 μm and not greater than 4 μm is determined as being good in adhesion of Ni plating and "A" is shown in the field in Table 11. A specimen of which thickness of Ni plating is smaller than 1 μm is determined as being poor in adhesion of Ni plating and "B" is shown in the field in Table 11.

A method of evaluating separation between ceramic insulator 1 and terminal electrodes 2*a* to 2*e* will be described. Evaluation-purpose ceramic electronic component 100A is from separation between ceramic insulator 1 and each terminal electrode and "A" is shown in the field of separation in evaluation result in Table 11. Specimens among which even one is found to be impregnated with the fluorescent solution in the portion between ceramic insulator 1 and each terminal electrode are determined as having experienced separation between ceramic insulator 1 and each terminal electrode and "B" is shown in the field in Table 11.

A method of evaluating denseness of terminal electrodes 2*a* to 2*e* will be described. A cross-section of evaluation-purpose ceramic electronic component 100A exposed with a method the same as above is observed with a fluorescent microscope and a depth of impregnation with the fluorescent solution into terminal electrodes 2*a* to 2*e* is observed. The number of measurement samples is set to ten for each of terminal electrodes 2*a* to 2*e*.

An average value of depths of impregnation with the fluorescent solution for each of terminal electrodes 2*a* to 2*e* is calculated. A specimen of which depth of impregnation with the fluorescent solution is smaller than 5 μm is determined as being particularly good in denseness and "S" is shown in the field of denseness in evaluation result in Table 11. A specimen of which depth of impregnation with the fluorescent solution is not smaller than 5 μm and not greater than 10 μm is determined as being good in denseness and "A" is shown in the field in Table 11. A specimen of which depth of impregnation with the fluorescent solution exceeds 10 μm is determined as being poor in denseness and "B" is shown in the field in Table 11.

A specimen including even one item evaluated as "B" among three items of adhesion of plating, separation, and denseness evaluated as above is determined as being out of the range of this invention and "B" is shown in the field of comprehensive evaluation in evaluation result in Table 11. A specimen without any item evaluated as "B" among the three items, in which adhesion of plating of terminal electrode 2*c* (in a square shape having one side of 100 μm) is evaluated as "S", is determined as being particularly good and "S" is shown in the field in Table 11. A specimen without any item evaluated as "B" among the three items, in which adhesion of plating of terminal electrode 2*c* is evaluated as "A", is determined as being good and "A" is shown in the field in Table 11.

As is clear from Table 11, evaluation-purpose ceramic electronic components 100A having analytical specimen numbers S-1 to S-9 and analytical specimen numbers S-17 and S-18 within the range of this invention are excellent in adhesion of plating, separation, and denseness.

As described previously, in ceramic insulator 1 included in evaluation-purpose ceramic electronic component 100A, in firing yet-to-be-fired ceramic electronic component 10A, ions of the metal in common described previously are diffused into the amorphous material in ceramic insulator 1. Since a solid solubility limit of the ions is low, ions of the element in common and the component in the amorphous material react with each other and the crystalline material is precipitated from the amorphous material. Consequently, an amount of the amorphous material contained in ceramic insulator 1 decreases. When the ions of the element in common and the amorphous material react with each other and the amorphous material is converted to the crystalline material, a metal element in the amorphous material (for example, an alkaline-earth metal element) with a function to lower a viscosity of the amorphous material in a molten state at a high temperature is taken into the crystalline material. Therefore, the remaining amorphous material is high in viscosity at a high temperature.

It is considered that, owing to the effect above, in firing yet-to-be-fired ceramic electronic component 10A, the amorphous material introduced into yet-to-be-fired terminal electrodes 6*a* to 6*e* from yet-to-be-fired ceramic insulator 7 decreases and covering of the upper surface of terminal electrodes 2*a* to 2*e* with the amorphous material is suppressed.

$TiO_2$ which makes a difference in basicity smaller is smaller than $Al_2O_3$ in amount of solid solution in the amorphous material in ceramic insulator 1. In addition, when $TiO_2$ solid solution is formed in the amorphous material in yet-to-be-fired ceramic insulator 7, the crystalline material (fresnoite) is immediately formed. It is consequently estimated that a viscosity of the amorphous material in ceramic insulator 1 in the adjacent region surrounding yet-to-be-fired terminal electrodes 6*a* to 6*e* increases and introduction of the amorphous material into yet-to-be-fired terminal electrodes 6*a* to 6*e* is blocked.

<Modification of Method of Manufacturing Ceramic Electronic Component>

A modification of the method of manufacturing ceramic electronic component 100 according to the first embodiment of this invention will be described with reference to FIGS. 7 to 9. A modification of the method of manufacturing evaluation-purpose ceramic electronic component 100A is incorporated as the description of the modification of the method of manufacturing ceramic electronic component 100 also in the description below.

In the modification, the first to third steps and the fifth step are the same as in the method of manufacturing evaluation-purpose ceramic electronic component 100A described previously. The fourth step further including a shrinkage suppression green sheet layering step will be described below, and detailed description of other steps will briefly be mentioned.

A shrinkage suppression green sheet 8 containing $Al_2O_3$ as source material powders for a shrinkage suppression material is obtained with a method the same as the first step in the method of manufacturing evaluation-purpose ceramic electronic component 100A described previously. Through the first to third steps, green sheet 5 having yet-to-be-fired terminal electrodes 6*a* to 6*e* of various sizes formed is obtained.

Figure 7:
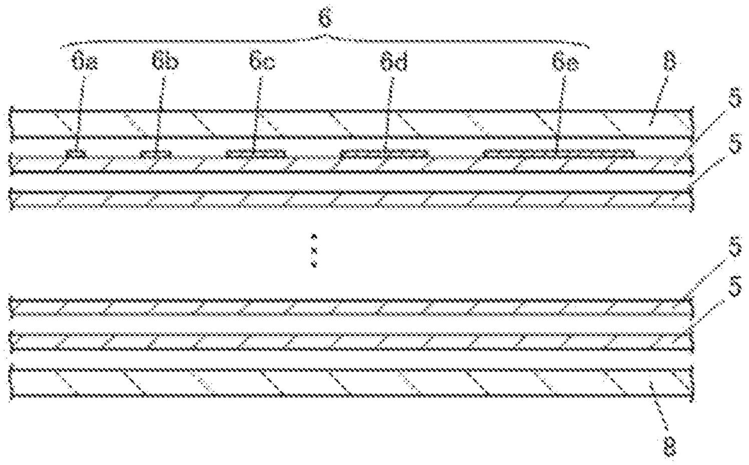
FIG. 7 is a diagram similarly schematically showing a process of layering shrinkage suppression green sheets 8 and green sheets 5 including the green sheet having yet-to-be-fired terminal electrodes 6*a* to 6*e* formed in the fourth step further including a shrinkage suppression green sheet layering step.

FIG. 7 is a diagram schematically showing a process of layering shrinkage suppression green sheets 8 and green sheets 5 including the green sheet having yet-to-be-fired terminal electrodes 6*a* to 6*e* formed when the fourth step (green sheet layering step) described previously further includes the shrinkage suppression green sheet layering step.

A yet-to-be-fired ceramic electronic component 10B is obtained by layering a prescribed number of shrinkage suppression green sheets 8 obtained as above and a prescribed number of green sheets 5 and thermally compression bonding them in the fourth step. Compression bonded yet-to-be-fired ceramic electronic component 10B is set to lie between shrinkage suppression green sheets 8 such that yet-to-be-fired terminal electrodes 6*a* to 6*e* do not lie between green sheets 5. Though the number of shrinkage suppression green sheets 8 to be layered is set to any number, the shrinkage suppression green sheets should be layered to such an extent that shrinkage of yet-to-be-fired ceramic electronic component 10B in the direction of the main surface during firing is suppressed.

Figure 8:
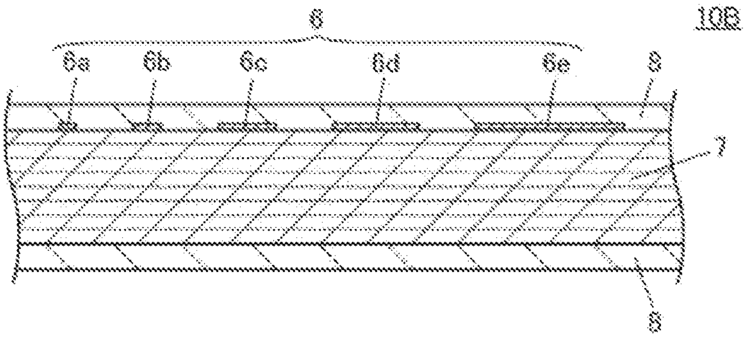
FIG. 8 is a diagram similarly schematically showing a yet-to-be-fired ceramic electronic component 10B lying between shrinkage suppression green sheets 8 obtained in the fourth step further including the shrinkage suppression green sheet layering step.

FIG. 8 is a diagram schematically showing yet-to-be-fired ceramic electronic component 10B lying between shrinkage suppression green sheets 8. Conditions for thermal compression bonding are the same as those in thermal compression bonding of yet-to-be-fired ceramic electronic component 10A. Yet-to-be-fired ceramic electronic component 10B includes yet-to-be-fired ceramic insulator 7, yet-to-be-fired terminal electrodes 6*a* to 6*e*, and shrinkage suppression green sheet 8.

Figure 9:
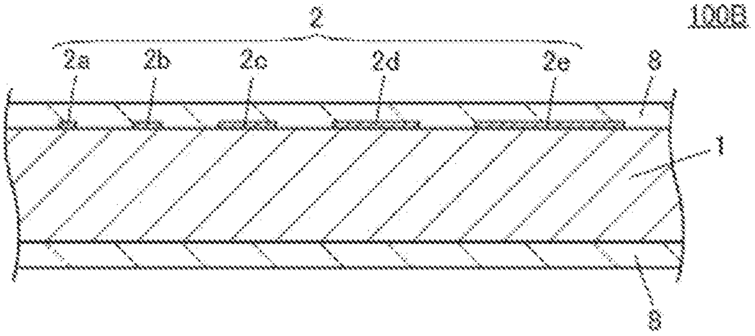
FIG. 9 is a diagram similarly schematically showing an evaluation-purpose ceramic electronic component 100B lying between shrinkage suppression green sheets 8 obtained in the fifth step (firing step).

Thereafter, an evaluation-purpose ceramic electronic component 100B lying between shrinkage suppression layers 9 shown in FIG. 9 is obtained by firing yet-to-be-fired ceramic electronic component 10B in the fifth step (firing step). Thereafter, the shrinkage suppression layers are removed by sand-blasting evaluation-purpose ceramic electronic component 100B. Evaluation-purpose ceramic electronic component 100A described previously can be obtained as above.

According to the method of manufacturing a ceramic electronic component, shrinkage of ceramic insulator 1 and terminal electrodes 2*a* to 2*e* in the direction of the main surface is suppressed as described previously. Therefore, dimension accuracy of the fired ceramic electronic component can extremely be high.

<<Second Embodiment of Ceramic Electronic Component>>

A ceramic electronic component 200 according to an embodiment of this invention will be described with reference to FIGS. 10A and 10B. Ceramic electronic component 100 in the first embodiment is a ceramic electronic component in which a terminal electrode is formed on a surface of a chip type ceramic electronic component body.

Figure 10A:
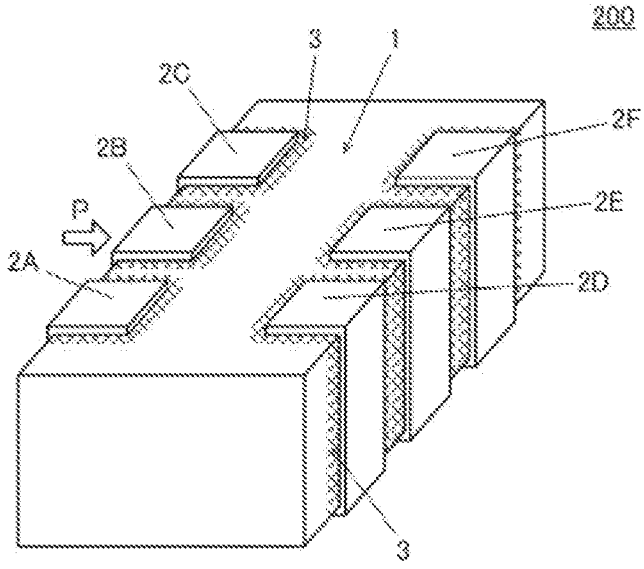
FIG. 10A is a perspective view of a ceramic electronic component (chip type ceramic electronic component) 200 according to a second embodiment of this invention.
Figure 10B:
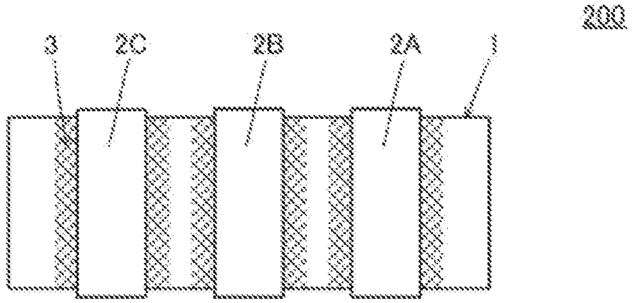
FIG. 10B is a side view of ceramic electronic component (chip type ceramic electronic component) 200 according to the second embodiment of this invention.
Figure 11:
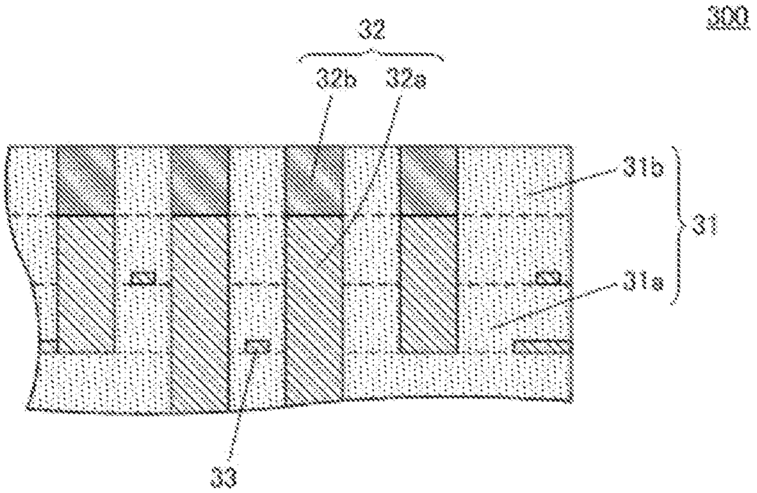
FIG. 11 is a diagram schematically showing a cross-section of a ceramic wiring board 300 according to the background art.

FIG. 10A is a perspective view of ceramic electronic component 200. FIG. 10B is a side view of ceramic electronic component 200.

Ceramic electronic component 200 includes ceramic insulator 1 and terminal electrodes 2A to 2F. In ceramic electronic component 200 as well, as in ceramic electronic component 100 described previously, ceramic insulator 1 contains a crystalline material and an amorphous material and terminal electrodes 2A to 2F contain a metal and an oxide. The crystalline material and the oxide contain at least one type of metal element in common. The oxide in terminal electrodes 2A to 2F is diffused during firing, and the adjacent region which surrounds terminal electrodes 2A to 2F and has a thickness of 5 μm is higher in concentration of the metal element than the remote region which is distant from the terminal electrode by 100 μm and has a thickness of 5 μm.

Not only in the ceramic wiring board but also in the chip type ceramic electronic component, covering of the upper surface of terminal electrodes 2A to 2F with the amorphous material is similarly suppressed. Consequently, a plating film can reliably and readily be formed on the upper surface of the terminal electrode. Ions of the metal element which is the component of the oxide in terminal electrodes 2A to 2F are diffused in the amorphous material in the ceramic insulator, so that terminal electrodes 2A to 2F and ceramic insulator 1 are firmly bonded to each other and separation between terminal electrodes 2A to 2F and ceramic insulator 1 is suppressed.

This invention is not limited to the embodiments above and is susceptible to various applications and modifications within the scope of this invention. It is pointed rout that functions described herein are presumed functions and that this invention is not implemented only by these functions. It is also pointed out that each embodiment described herein is illustrative and partial replacement or combination of features in different embodiments can be made.

Though embodiments and modifications of the present invention have been described above, the embodiments and the modifications disclosed herein are illustrative and non-restrictive in every respect. The scope of the present invention is defined by the terms of the claims and includes any modifications within the scope and meaning equivalent to the terms of the claims.

REFERENCE SIGNS LIST

100, 200 ceramic electronic component; 1 ceramic insulator, 2 terminal electrode; 3 adjacent region; and 4 remote region

The invention claimed is:

1. A ceramic electronic component comprising:

a ceramic insulator containing a crystalline material and an amorphous material; and a terminal electrode on a surface of the ceramic insulator, the terminal electrode containing a metal and an oxide, the crystalline material and the oxide containing in common at least one type of a metal element, and in the ceramic insulator, an adjacent region which surrounds the terminal electrode and has a thickness of 5 μm measured as extending outwardly from a border between the terminal electrode and the ceramic insulator is higher in concentration of the metal element than a remote region which is distant from the border between the terminal electrode and the ceramic insulator by 100 μm and has a thickness of 5 μm.

2. The ceramic electronic component according to claim 1, wherein an absolute value of a difference in basicity between the amorphous material and the oxide is not greater than 0.049 when a basicity B of the oxide is calculated as follows:

$$B = \sum_i n_i B(Mi - O) \tag{1}$$

$$B(Mi - O) = \frac{B(Mi - O_0) - B(Si - O_0)}{B(Ca - O_0) - B(Si - O_0)} \tag{2}$$

$$B(Mi - O_0) = \frac{(r_{Mi} + 1.4)^2}{2Z_{Mi}} \tag{3}$$

where B(Mi-O) is a basicity of each oxide in the terminal electrode, Mi is a cation, MiO is an oxide, $B(Mi\text{-}O_0)$ is an oxygen donation capability of MiO, $B(Si—O_0)$ is an oxygen donation capability of $SiO_2$, $B(Ca—O_0)$ is an oxygen donation capability of CaO, $n_i$ is a composition ratio of each cation Mi, $r_{Mi}$ is an ion radius (Å) according to Pauling of each cation Mi, and $Z_{Mi}$ is a valence of each cation Mi.

3. The ceramic electronic component according to claim 1, wherein the adjacent region contains the crystalline material composed of the metal element.

4. The ceramic electronic component according to claim 3, wherein the crystalline material and the oxide contain Ti in common as the metal element.

5. The ceramic electronic component according to claim 4, wherein the crystalline material composed of the metal element contains a fresnoite compound containing Ba, Ti, and Si.

6. The ceramic electronic component according to claim 3, wherein the crystalline material and the oxide contain Al in common as the metal element.

7. The ceramic electronic component according to claim 6, wherein the crystalline material composed of the metal element contains a celsian compound containing Ba, Al, and Si.

8. The ceramic electronic component according to claim 3, wherein the amorphous material contains Ba and Si, and the crystalline material composed of the metal element contains an Si oxide, a fresnoite compound containing Ba, Ti, and Si, and a celsian compound containing Ba, Al, and Si.

* * * * *